(12) United States Patent
Domae et al.

(10) Patent No.: US 12,374,401 B2
(45) Date of Patent: Jul. 29, 2025

(54) SEMICONDUCTOR MEMORY DEVICE

(71) Applicant: Kioxia Corporation, Tokyo (JP)

(72) Inventors: Sumiko Domae, Yokohama (JP);
Kyosuke Sano, Kamakura (JP)

(73) Assignee: Kioxia Corporation, Tokyo (JP)

( * ) Notice: Subject to any disclaimer, the term of this patent is extended or adjusted under 35 U.S.C. 154(b) by 178 days.

(21) Appl. No.: 18/456,554

(22) Filed: Aug. 28, 2023

(65) Prior Publication Data

US 2024/0087649 A1 Mar. 14, 2024

(30) Foreign Application Priority Data

Sep. 5, 2022 (JP) .................. 2022-140663

(51) Int. Cl.
| | | |
|---|---|---|
| *G11C 16/04* | (2006.01) | |
| *G11C 16/08* | (2006.01) | |
| *H10B 41/27* | (2023.01) | |
| *H10B 41/35* | (2023.01) | |
| *H10B 43/27* | (2023.01) | |
| *H10B 43/35* | (2023.01) | |

(52) U.S. Cl.
CPC .......... *G11C 16/08* (2013.01); *G11C 16/0483* (2013.01); *H10B 41/27* (2023.02); *H10B 41/35* (2023.02); *H10B 43/27* (2023.02); *H10B 43/35* (2023.02)

(58) Field of Classification Search
CPC ..... G11C 16/08; G11C 16/0483; G11C 16/10; G11C 16/24; G11C 16/3459; H10B 41/27; H10B 41/35; H10B 43/27; H10B 43/35; H10B 41/10; H10B 41/41; H10B 43/10; H10B 43/40; H10D 64/035; H10D 64/037

USPC ................................................... 365/185.23
See application file for complete search history.

(56) References Cited

U.S. PATENT DOCUMENTS

| | | | | |
|---|---|---|---|---|
| 8,885,411 B2* | 11/2014 | Kamigaichi | ....... | G11C 16/0483 365/185.28 |
| 8,891,315 B2* | 11/2014 | Lee | ..................... | G11C 16/3445 365/185.11 |
| 10,037,813 B2* | 7/2018 | Maejima | ............ | G11C 16/3459 |
| 2010/0046290 A1* | 2/2010 | Park | ..................... | G11C 16/0483 365/185.18 |
| 2010/0124116 A1 | 5/2010 | Maeda et al. | | |
| 2011/0235421 A1 | 9/2011 | Itagaki et al. | | |

(Continued)

FOREIGN PATENT DOCUMENTS

| | | |
|---|---|---|
| JP | 2010-118580 A | 5/2010 |
| JP | 2011-198435 A | 10/2011 |

(Continued)

*Primary Examiner* — Tha-O H Bui
(74) *Attorney, Agent, or Firm* — Oblon, McClelland, Maier & Neustadt, L.L.P.

(57) ABSTRACT

A semiconductor memory device according to an embodiment includes: a driver for supplying a voltage, the driver in the first step, when a current flows through the first substring, the second substring, the third substring, or the fourth substring, performing a second step of applying the first voltage to the bit line, applying a fourth voltage higher than the third voltage to the third select gate line, the fourth select gate line, the fifth select gate line, and the sixth select gate line, and applying a fifth voltage higher than the third voltage and lower than the fourth voltage to the first word lines and the second word lines.

11 Claims, 26 Drawing Sheets

(56) References Cited

U.S. PATENT DOCUMENTS

| | | |
|---|---|---|
| 2017/0236595 A1 | 8/2017 | Maejima et al. |
| 2017/0271021 A1 | 9/2017 | Futatsuyama et al. |
| 2018/0068727 A1 | 3/2018 | Harada |
| 2020/0090741 A1 | 3/2020 | Suzuki |
| 2020/0126628 A1 | 4/2020 | Maejima |
| 2023/0078441 A1 | 3/2023 | Sumi et al. |

FOREIGN PATENT DOCUMENTS

| | | |
|---|---|---|
| JP | 2017-142874 A | 8/2017 |
| JP | 2017-168163 A | 9/2017 |
| JP | 2018-41523 A | 3/2018 |
| JP | 2020-47329 A | 3/2020 |
| JP | 2020-68044 A | 4/2020 |
| JP | 2023-40926 A | 3/2023 |

* cited by examiner

FIG. 19

| | Selected string | Unselected string 2 | Unselected string 3 | Unselected block |
|---|---|---|---|---|
| BL | | Vbl | | Vss |
| SGD | Vcgrv | Vbb | Vss | Vss |
| WLDD1 | Vread | Vbb | | Floating |
| WLDD0 | Vread | Vread | | Floating |
| WL | Vread | Vread | | Floating |
| WLDS1, WLDS0 | Vread | Vread | | Floating |
| SGS | Vsg | Vss | | Vss |
| SL | | Vcelsrc | | |

FIG. 20

| | Selected string | Unselected string 2 | Unselected string 3 | Unselected block |
|---|---|---|---|---|
| BL | | Vbl | | |
| SGD | Vcgrv | Vbb | Vbb | Vss |
| WLDD1 | Vread | Vbb | | Floating |
| WLDD0 | Vread | Vread | | Floating |
| WL | Vread | Vread | | Floating |
| WLDS1, WLDS0 | Vread | Vread | | Floating |
| SGS | Vsg | Vss | | Vss |
| SL | | Vcelsrc | | |

FIG.21

| | Selected string | Unselected string 2 | Unselected string 3 | Unselected block |
|---|---|---|---|---|
| BL | | Vbl | | Vss |
| SGD | Vcgrv | Vbb | Vss | Floating |
| WLDD1 | Vread | Vbb+Vm | | Floating |
| WLDD0 | Vread | Vread | | Floating |
| WL | Vread | Vread | | Floating |
| WLDS1, WLDS0 | Vread | Vsg | | Vss |
| SGS | Vsg | Vss | | |
| SL | | Vcelsrc | | |

FIG.22

| | Selected string | Unselected string 2 | Unselected string 3 | Unselected block |
|---|---|---|---|---|
| BL | Vbl | | | |
| SGD | Vcgrv | Vbb | Vbb | Vss |
| WLDD1 | Vread | Vbb+Vm | | Floating |
| WLDD0 | Vread | Vread | | Floating |
| WL | Vread | Vread | | Floating |
| WLDS1, WLDS0 | Vread | Vread | | Floating |
| SGS | Vsg | Vss | | Vss |
| SL | Vcelsrc | | | |

SEMICONDUCTOR MEMORY DEVICE

CROSS-REFERENCE TO RELATED APPLICATION

This application is based upon and claims the benefit of priority from Japanese Patent Application No. 2022-140663, filed on Sep. 5, 2022, the entire contents of which are incorporated herein by reference.

FIELD

Embodiments described herein relate generally to a semiconductor memory device.

BACKGROUND

A NAND flash memory is known as a non-volatile semiconductor memory device.

BRIEF DESCRIPTION OF THE DRAWINGS

FIG. 19 is exemplary voltage applied in S8 of FIG. 18.

FIG. 20 is another exemplary voltage applied in S8 of FIG. 18.

FIG. 21 is another exemplary voltage applied in S8 of FIG. 18.

FIG. 22 is another exemplary voltage applied in S8 of FIG. 18.

DETAILED DESCRIPTION

Figure 1:
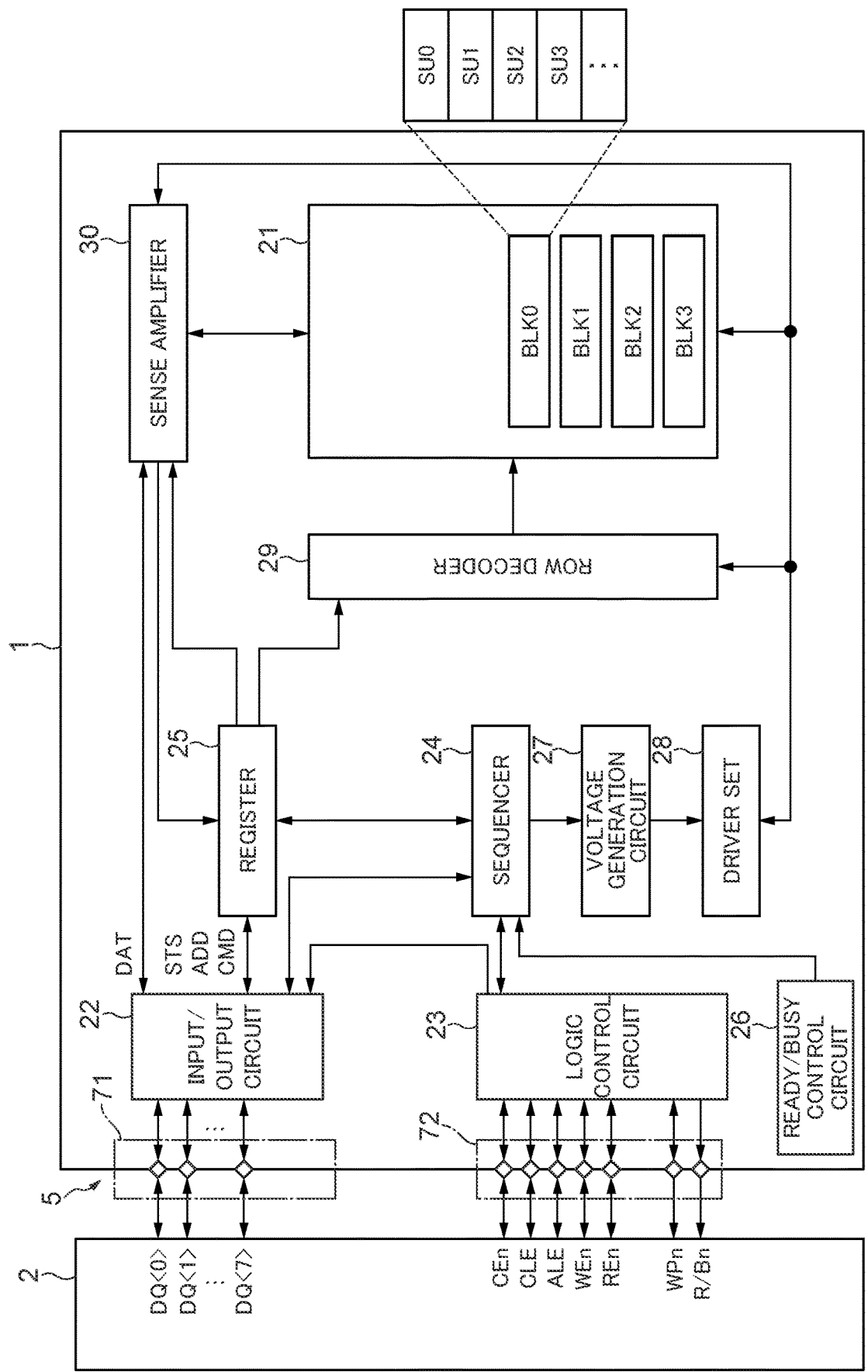
FIG. 1 is a block diagram showing the configuration of a memory system including a semiconductor memory device according to a first embodiment.

Hereinafter, embodiments will be described with reference to the diagrams. In addition, in the diagrams, the same or similar elements are denoted by the same or similar reference numerals.

First Embodiment

FIG. 1 is a block diagram showing an example of the configuration of a memory system 3 including a semiconductor memory device 1 according to a first embodiment. The configuration of the memory system 3 including the semiconductor memory device 1 according to the first embodiment is not limited to the configuration shown in FIG. 1.

As shown in FIG. 1, the memory system 3 includes the semiconductor memory device 1 and a memory controller 2. The memory system 3 is, for example, a memory card such as an SSD (solid state drive) or an SDTM card. The memory system 3 may include a host device (not shown).

The semiconductor memory device 1 is connected to, for example, the memory controller 2, and is controlled by using the memory controller 2. The memory controller 2 receives, for example, an instruction necessary for the operation of the semiconductor memory device 1 from the host device, and transmits the instruction to the semiconductor memory device 1. The memory controller 2 transmits the instruction to the semiconductor memory device 1 to control the reading of data from the semiconductor memory device 1, writing of data into the semiconductor memory device 1, or erasing data in the semiconductor memory device 1. In embodiments, the semiconductor memory device 1 is, for example, a NAND flash memory.

As shown in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier 30, an input/output pad group 71, and a logic control pad group 72. In the semiconductor memory device 1, various operations, such as a write operation for storing write data DAT in the memory cell array 21 and a read operation for reading read data DAT from the memory cell array 21, are executed. The configuration of the semiconductor memory device 1 according to embodiments is not limited to the configuration shown in FIG. 1.

The memory cell array 21 is connected to, for example, the sense amplifier 30, the row decoder 29, and the driver set 28. The memory cell array 21 includes blocks BLK0, BLK1, . . . , BLKn (n is an integer of 1 or more). Although details will be described later, each block BLK includes a plurality of string units SU (SU0, SU1, SU2, . . . ). Each of the string units SU includes a plurality of non-volatile memory cells associated with bit lines and word lines. The block BLK is, for example, a data erasing unit. Data held by memory cell transistors MT (FIG. 2) included in the same block BLK is collectively erased.

In the semiconductor memory device 1, for example, a TLC (triple-level cell) method or a QLC (quadruple level cell) method can be applied. In the TLC method, 3-bit data is held in each memory cell, and in the QLC method, 4-bit data is held in each memory cell. In addition, data of 2 bits or less may be held in each memory cell, or data of 5 bits or more may be held in each memory cell.

The input/output circuit 22 is connected to, for example, the register 25, the logic control circuit 23, and the sense amplifier 30. The input/output circuit 22 controls the transmission and reception of a data signal DQ<7:0> between the memory controller 2 and the semiconductor memory device 1.

The data signal DQ<7:0> is an 8-bit signal. The data signal DQ<7:0> is an entity of data transmitted and received between the semiconductor memory device 1 and the memory controller 2, and includes a command CMD, data DAT, address information ADD, status information STS, and the like. The command CMD includes, for example, an instruction for executing an instruction transmitted from the host device (memory controller 2) to the semiconductor device 1. The data DAT includes the data DAT written into the semiconductor memory device 1 or the data DAT read from the semiconductor memory device 1. The data DAT includes the data DAT written into the semiconductor memory device 1 or the data DAT read from the semiconductor memory device 1. The address information ADD includes, for example, a column address and a row address for selecting a plurality of non-volatile memory cells associated with bit lines and word lines. The status information STS includes, for example, information regarding the status of the semiconductor memory device 1 regarding the write operation and the read operation.

More specifically, the input/output circuit 22 includes an input circuit and an output circuit, and the input circuit and the output circuit perform processing described below. The input circuit receives the write data DAT, the address information ADD, and the command CMD from the memory controller 2. The input circuit transmits the received write data DAT to sense amplifier 70, and the input circuit transmits the received address information ADD and commands CMD to register 25. On the other hand, the output circuit receives the status information STS from the register 25, and receives the read data DAT from the sense amplifier 30. The output circuit transmits the received status information STS and read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the received signals.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address information ADD. The write enable signal WEn and the read enable signal REn are, for example, signals for instructing the input/output circuit 22 to input and output the data signal DQ, respectively. The write protect signal WPn is a signal for instructing the semiconductor memory device 1 to prohibit writing and erasing of data.

The sequencer 24 is connected to, for example, the ready/busy control circuit 26, the sense amplifier 30, and the driver set 28. The sequencer 24 controls the overall operation of the semiconductor memory device 1 based on the command CMD held in the command register. For example, the sequencer 24 controls the sense amplifier 30, the row decoder 29, the voltage generation circuit 27, the driver set 28, and the like to execute various operations, such as a write operation and a read operation.

The register 25 includes, for example, a status register (not shown), an address register (not shown), a command register (not shown), and the like. The status register receives the status information STS from the sequencer 24, holds the status information STS, and transmits the status information STS to the input/output circuit 22 based on the instruction of the sequencer 24. The address register receives the address information ADD from the input/output circuit 22 and holds the address information ADD. The address register transmits a column address in the address information ADD to the sense amplifier 30, and transmits a row address in the address information ADD to the row decoder 29. The command register receives the command CMD from the input/output circuit 22, holds the command CMD, and transmits the command CMD to the sequencer 24.

The ready/busy control circuit 26 generates a ready/busy signal R/Bn according to the control of the sequencer 24, and transmits the generated ready/busy signal R/Bn to the memory controller 2. The ready/busy signal R/Bn is a signal for notifying whether the semiconductor memory device 1 is in a ready state in which an instruction from the memory controller 2 is accepted or in a busy state in which no instruction is accepted.

The voltage generation circuit 27 is connected to, for example, the driver set 28 or the like. The voltage generation circuit 27 generates a voltage used for a write operation, a read operation, and the like based on the control of the sequencer 24, and supplies the generated voltage to the driver set 28.

Figure 12:
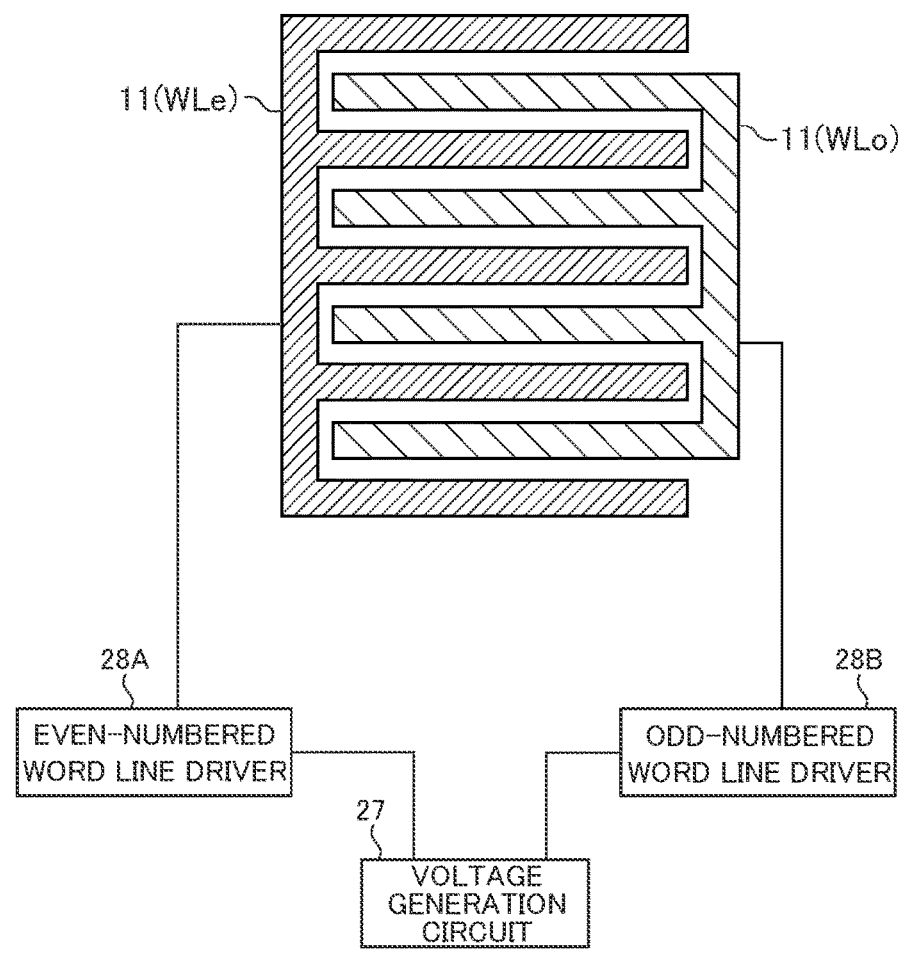
FIG. 12 is a diagram for explaining the electrical connection of a voltage generation circuit, a driver set, a select gate line, or a word line according to the first embodiment.

The driver set 28 includes, for example, an even side driver 28A (FIG. 12) and an odd side driver 28B (FIG. 12). The driver set 28 is connected to the memory cell array 21, the sense amplifier 70, and the row decoder 29. Based on the voltage supplied from the voltage generation circuit 27, the driver set 28 generates various voltages to be applied to a select gate line SGD (FIG. 2), a word line WL (FIG. 2), a source line SL (FIG. 2), and the like in various operations such as a read operation and a write operation, for example. The driver set 28 supplies the generated voltage to the even side driver 28A, the odd side driver 28B, the sense amplifier 30, the row decoder 29, the source line SL, and the like.

The row decoder 29 receives a row address from the address register and decodes the received row address. The row decoder 29 selects a block BLK, in which various operations such as a read operation and a write operation are to be executed, based on the decoding result. The row decoder 29 can supply the voltage supplied from the driver set 28 to the selected block BLK.

The sense amplifier 30 receives a column address from the address register and decodes the received column address, for example. In addition, the sense amplifier 30 executes an operation of transmitting and receiving the data DAT between the memory controller 2 and the memory cell array 21 based on the decoding result. The sense amplifier 30 includes, for example, a sense amplifier unit (not shown) provided for each bit line. The sense amplifier 30 makes it possible to supply a voltage to the bit line BL by using the sense amplifier unit. For example, the sense amplifier 30 can supply a voltage to a bit line by using a sense amplifier unit. In addition, the sense amplifier 30 senses the data read from the memory cell array 21, generates the read data DAT, and transmits the generated read data DAT to the memory controller 2 through the input/output circuit 22. In addition, the sense amplifier 30 receives the write data DAT from the memory controller 2 through the input/output circuit 22, and transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transmits the chip enable signal CEn, the command latch enable signal CLE, the address latch enable signal ALE, the write enable signal WEn, and the read enable signal REn received from the memory controller 2 to the logic control circuit 23. The logic control pad group 72 transmits the ready/busy signal R/Bn received from the ready/busy control circuit 26 to the memory controller 2.

Figure 2:
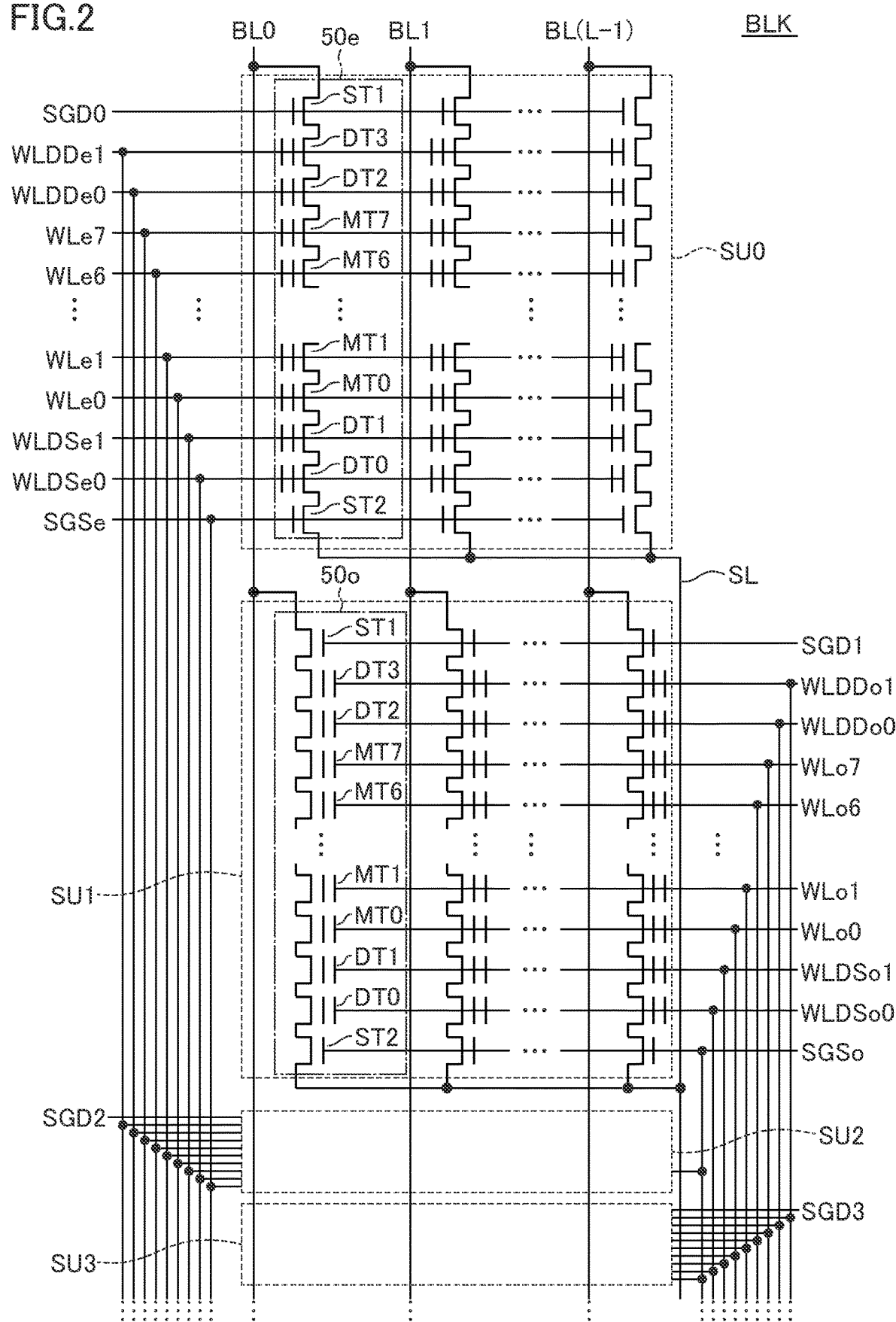
FIG. 2 is a schematic diagram showing the circuit configuration of a memory cell array in the semiconductor memory device according to the first embodiment.

FIG. 2 is an example of the circuit configuration of the memory cell array 21 shown in FIG. 1. FIG. 2 is a diagram showing the circuit configuration of one block BLK among a plurality of blocks BLK included in the memory cell array 21. For example, each of the plurality of blocks BLK included in the memory cell array 21 has the circuit configuration shown in FIG. 2. The configuration of the memory cell array 21 according to embodiments is not limited to the configuration shown in FIG. 2. In the description of FIG. 2, the description of the same or similar configuration as that of FIG. 1 may be omitted.

As shown in FIG. 2, the block BLK includes a plurality of string units SU (SU0, SU1, SU2, and SU3). In embodiments, the write operation and the read operation are executed in units of the string unit SU (page). Each of the string units SU includes a plurality of NAND strings 50. For example, the string units SU0 and SU2 include a plurality of NAND strings 50e, and the string units SU1 and SU3 include a plurality of NAND strings 50o. In addition, although FIG. 2 shows an example in which each block BLK includes four string units SU0, SU1, SU2, and SU3, the number of string units included in each block is not limited to four. For example, each block BLK may include 6 or more string units.

Each of the NAND strings 50 includes, for example, eight memory cell transistors MT (MT0 to MT7), four dummy transistors DT0, DT1, DT2 and DT3, and selection transistors ST1 and ST2. Each memory cell transistor MT includes a control gate and a charge storage layer, and holds data in a non-volatile manner. The dummy transistors DT are connected in series between the source of the selection transistor ST1 and the drain of the selection transistor ST2. The memory cell transistors MT are connected in series between the drain of the dummy transistor DT1 and the source of the dummy transistor DT2.

The gate of the selection transistor ST1 in each of the string units SU is connected to the select gate line SGD (SGD0, SGD1, ... ). The select gate line SGD is independently controlled by the row decoder 29. In addition, the gate of the selection transistor ST2 in each of the even-numbered string units SUe (SU0, SU2, ... ) is connected to, for example, an even-numbered select gate line SGSe, and the gate of the selection transistor ST2 in each of the odd-numbered string unit SUo (SU1, SU3, ... ) is connected to, for example, an odd-numbered select gate line SGSo. The even-numbered select gate line SGSe and the odd-numbered select gate line SGSo may be connected to each other so as to be controlled in the same manner, or may be independently provided so as to be independently controllable.

The control gates of the memory cell transistors MT (MT0 to MT7) included in the string unit SUe in the same block BLK are commonly connected to a word line WLe (WLe0 to WLe7). The control gates of the memory cell transistors MT (MT0 to MT7) included in the string unit SUo in the same block BLK are commonly connected to a word line WLo (WLo0 to WLo7). Select gate line WLe and select gate line WLo are independently controlled by row decoder 29.

The control gates of the dummy transistors DT0, DT1, DT2 and DT3 included in the string unit SUe in the same block BLK are commonly connected to dummy word lines WLDSe0, WLDSe1, WLDDe0, and WLDDe1. The control gates of the dummy transistors DT0, DT1, DT2 and DT3 included in the string unit SUo in the same block BLK are commonly connected to dummy word lines WLDSo0, WLDSo1, WLDDo0, and WLDDo1. The dummy word lines WLDSo0, WLDSo1, WLDDo0 and WLDDo1 are independently controlled by the row decoder 29.

The drains of the selection transistors ST1 of the NAND strings 50 in the same row in the memory cell array 21 are commonly connected to the bit line BL (BL0 to BL(L−1), where (L−1) is a natural number of 2 or more). That is, in the bit line BL, the NAND string 50 is commonly connected between the plurality of string units SU. The sources of the plurality of selection transistors ST2 are commonly connected to the source line SL. For example, the source line SL is electrically connected to the driver set 28, and a voltage is supplied from the voltage generation circuit 27 or the driver set 28 under the control of the voltage generation circuit 27 and the driver set 28 using the sequencer 24. In addition, the semiconductor memory device 1 according to embodiments may include a plurality of source lines SL. For example, each of the plurality of source lines SL may be electrically connected to the driver set 28, so that different voltages are supplied from the voltage generation circuit 27 or the driver set 28 to each of the plurality of source lines SL under the control of the voltage generation circuit 27 and the driver set 28 using the sequencer 24.

The string unit SU includes a plurality of NAND strings 50 connected to different bit lines BL and connected to the same select gate line SGD. The block BLK includes a plurality of string units SU having the common word line WL. The memory cell array 21 includes a plurality of blocks BLK having the common bit line BL. In the memory cell array 21, the above-described select gate line SGS, dummy word line WLDS, word line WL, dummy word line WLDD, and select gate line SGD are stacked above the source line layer, and the memory cell transistor MT is stacked in a three-dimensional manner.

Figure 3:
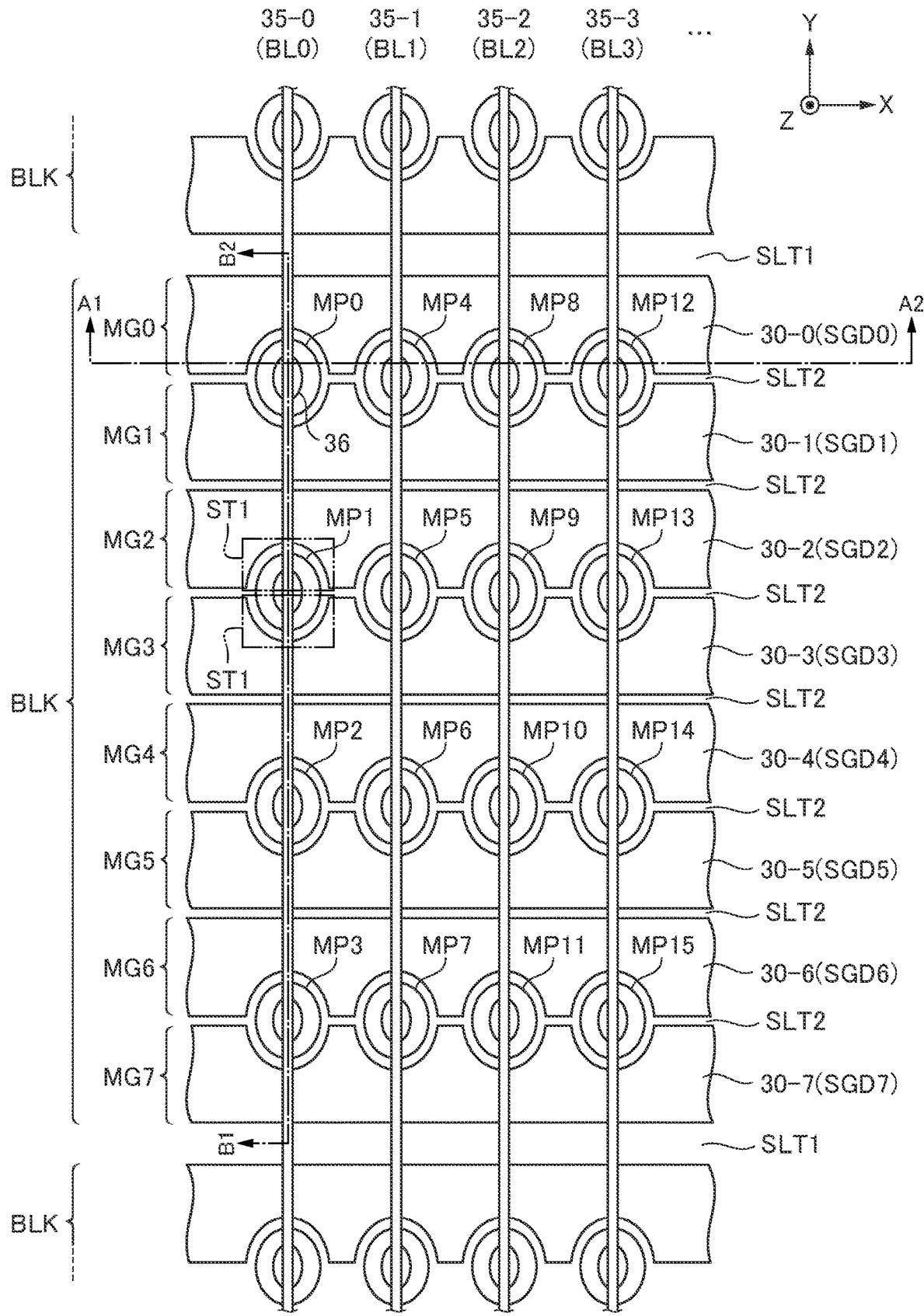
FIG. 3 is a schematic diagram illustrating an exemplary planar layout of the select gate line SGD in a XY plane of a BLK according to the first embodiment.

Next, an exemplary planar layout of the memory cell array 21 will be described. FIG. 3 shows an exemplary planar layout of the select gate line SGD in a XY plane for a certain blocking BL K. In the following description, XY plane corresponds to a plane parallel to the surface of the semiconductor substrate, and the X-direction (an example of the first direction) and the Y-direction (an example of the second direction) are perpendicular to each other. The Z-direction (an example of the third direction) is a direction perpendicular to XY directions, that is, a direction perpendicular to the surface of the semiconductor substrate.

In the present embodiment, when eight select gate lines SGD are included in one blocking BLK, an area including four bit lines BL(BL0~BL3) will be described.

As shown in FIG. 3, eight wiring layers 30 (30-0 to 30-7) extending in the X direction are arranged along the Y direction. Each of the wiring layers 30 functions as the select gate line SGD. Specifically, each of the wiring layers 30-0 to 30-7 functions as the select gate line SGD0~SGD7, respectively. Therefore, in XY plane view, the memory groups MG0~MG7 in the same block BLK are arranged along the Y-direction.

The wiring layer 30 adjacent to each other in the Y-direction in the block BLK are separated by an insulating film (not shown). The region where the insulating film is provided is referred to as the slit SLT2. In the slit SLT2, for example, an insulating film is buried in a region from the surface of the semiconductor substrate to at least a layer in which the wiring layer 30 is provided. A plurality of BLK shown in FIG. 3 are arranged in the memory cell array 21, for example, in the Y-direction. The blocks BLK adjacent to each other in the Y-direction are also separated from each other by an insulating film (not shown). The region where the insulating film is provided is referred to as the slit SLT1. The structure of the slit SLT1 is similar to the structure of the slit SLT2.

Further, a plurality of the memory pillars MP(MP0~MP15) along the Z-direction are provided between the wiring layers 30 adjacent to each other in the Y-direction so that the slit SLT2 provided with the pillars and the slit SLT2 without the pillars are alternately arranged.

Specifically, between the wiring layer 30-0 and 30-1, the memory pillars MP0, MP4, MP8, and MP12 are provided, between the wiring layer 30-2 and 30-3, the memory pillars MP1, MP5, MP9, and MP13 are provided, between the wiring layer 30-4 and 30-5, the memory pillars MP2, MP6, MP10, and MP14 are provided, and between the memory pillars 30-6 and 30-7, the memory pillars MP3, MP7, MP11, and MP15 are provided. The memory pillar MP corresponds to a set of the NAND string 20e and 20o, which will be described later.

The memory pillars MP0 to MP3 are arranged along the Y-direction. Similarly, the memory pillars MP4 to MP7, the memory pillars MP8 to MP11, and the memory pillars MP12 to MP15 are arranged along the Y-direction.

The memory pillars MP0, MP4, MP8 and MP12 are arranged along the X-direction. Similarly, the memory pillars MP1, MP5, MP9 and MP13, the memory pillars MP2, MP6, MP10 and MP14, and the memory pillars MP3, MP7, MP11 and MP15 are arranged along the X-direction.

The wiring layer 35-0 (the bit line BL0) is arranged so as to overlap with the memory pillars MP0 to MP3, and is commonly connected to the memory pillars MP0 to MP3. The wiring layer 35-1 (the bit line BL1) is arranged so as to overlap with the memory pillars MP4 to MP7, and is commonly connected to the memory pillars MP4 to MP7. The wiring layer 35-2 (the bit line BL2) is arranged so as to overlap with the memory pillars MP8 to MP11, and is commonly connected to the memory pillars MP8 to MP11. The wiring layer 35-3 (the bit line BL3) is arranged so as to overlap with the memory pillars MP12 to MP15, and is commonly connected to the memory pillars MP12 to MP15.

Figure 4:
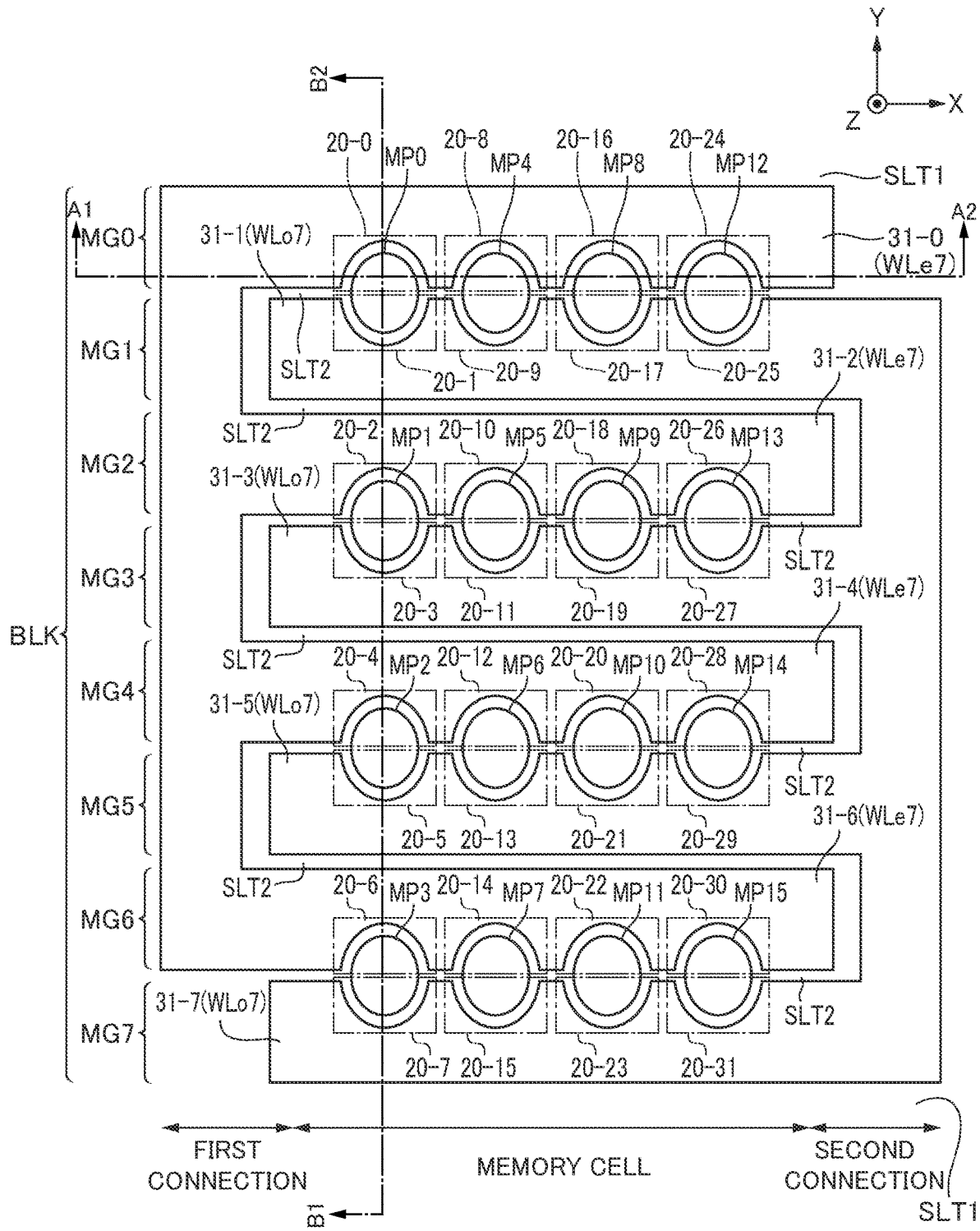
FIG. 4 is a schematic diagram illustrating an exemplary planar layout of the word line WL in the XY plane according to the first embodiment.

FIG. 4 shows an exemplary planar layout of the word line WL in the XY plane. FIG. 4 corresponds to an area corresponding to one block of FIG. 3, and is a layout of the wiring layer 31 provided below the wiring layer 30 described with reference to FIG. 3.

As shown in FIG. 4, eight wiring layers 31 (31-0 to 31-7) extending in the X direction are arranged along the Y direction. The wiring layers 31-0 to 31-7 are provided directly under the wiring layers 30-0 to 30-7, respectively, with an insulating film interposed therebetween.

Each wiring layer 31 functions as a word line WL7. Other word lines WL0~WL6 is also provided in the lower layer of the word line WL7 in the same manner. In the exemplary embodiment of FIG. 4, the wiring layers 31-0, 31-2, 31-4, and 31-6 function as the word line WLe7. The wiring layer 31-0, 31-2, 31-4, and 31-6 are pulled out to one side in the X-direction, and the pulled-out parts are commonly connected to each other. In the following, an area including a part where the wiring layer 31-0, 31-2, 31-4, and 31-6 are commonly connected is referred to as a first connection. The wiring layer 31-0, 31-2, 31-4, and 31-6 are connected to the row decoder module 12 via the first connection.

In addition, the wiring layers 31-1, 31-3, 31-5, and 31-7 function as word line WLo7. The wiring layer 31-1, 31-3, 31-5, and 31-7 are pulled out to the other side in the X-direction, and the pulled-out parts are commonly connected to each other. In the following, an area including a part where the wiring layer 31-1, 31-3, 31-5, and 31-7 are commonly connected is referred to as a second connection. The wiring layer 31-1, 31-3, 31-5, and 31-7 are connected to the row decoder 29 via the second connection.

The memory cell is provided between the first connection and the second connection. In the memory cell, the wiring layer 31 adjacent in the Y-direction are separated by the slit SLT2 described in FIG. 3. In addition, the wiring layer 31 between the block BLK adjacent to each other in the Y-direction is also separated by the slit SLT1. In the memory cell, the memory pillars MP0 to MP15 are provided in the same manner as in FIG. 3.

The above configuration is also applicable to another layer in which the dummy word line WLD, the wordline WL, and the select gate line SGS are formed. That is, the NAND string 20-0 is formed on the side where the memory pillar MP0 faces the word line WLe, and the NAND string 20-1 is formed on the side where the memory pillar MP0 faces the word line WLo. In addition, the NAND string 20-2 is formed on the side where the memory pillar MP1 faces the word line WLe, and the NAND string 20-3 is formed on the side where the memory pillar MP1 faces the word line WLo. The same applies to the memory pillar MP2 to MP15, in which an even-numbered NAND string 20e is formed on a side where the memory pillar MP faces the word line WLe, and an odd-numbered NAND string 20o is formed on a side where the memory pillar MP faces the word line WLo.

Figure 5:
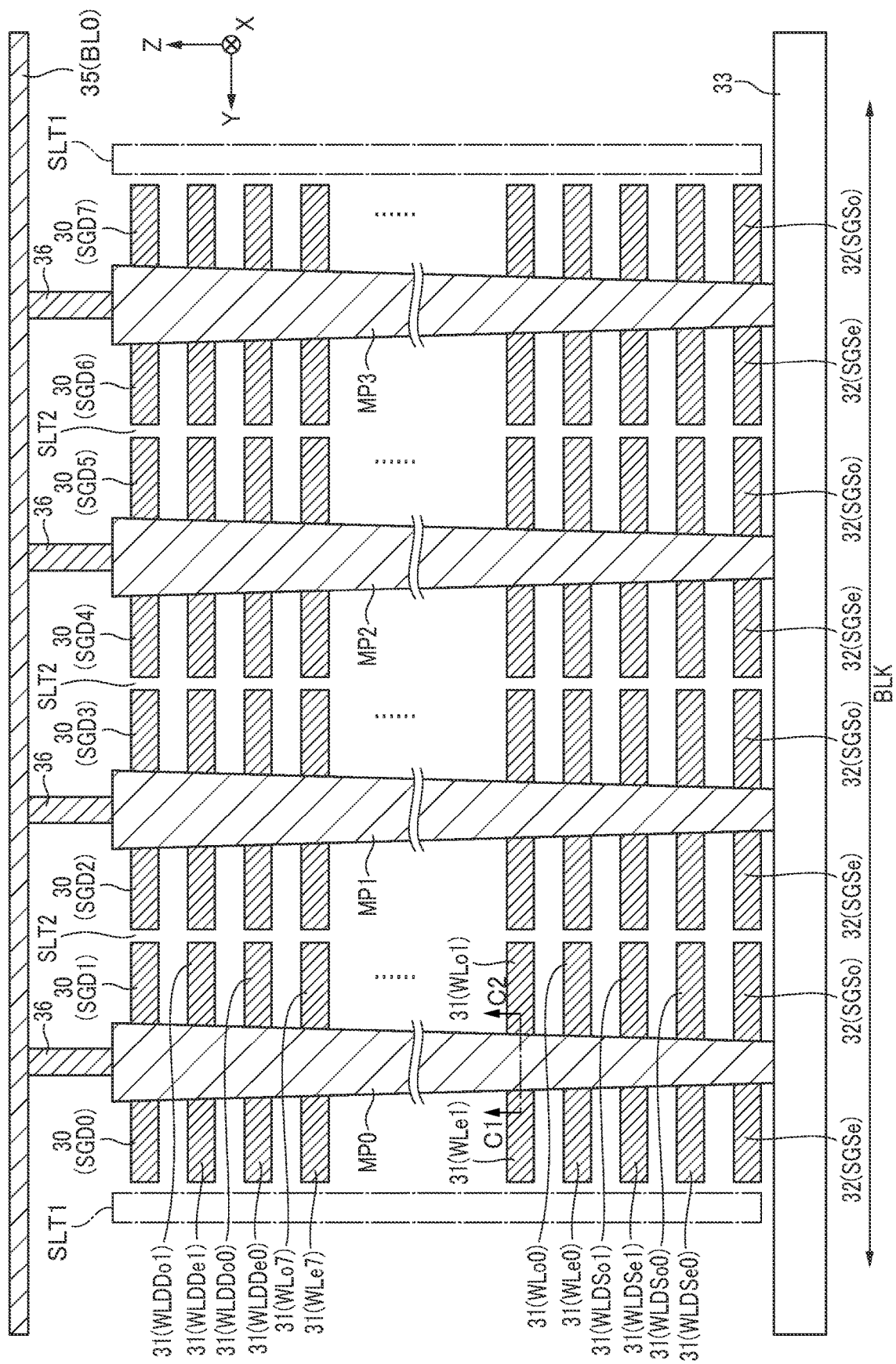
FIG. 5 is a cross-sectional view of a B1-B2 cut portion of the semiconductor memory device shown in FIGS. 3 and 4.

Next, an exemplary cross-sectional configuration of the memory cell array 21 will be described. FIG. 5 is a cross-sectional view of a B1-B2 cut portion shown in FIG. 4. FIG. 5 is a cross-sectional view of the block BLK taken along the Y-direction, and illustrating the cross-sectional configuration of the region along the wiring layer 35 (the bit line BL0) in FIG. 3, as an example. The cross-sectional view of the cut portion of the block BLK according to embodiments is not limited to the cross-sectional view of the cut portion shown in FIG. 5. In the description of FIG. 5, the description of the same or similar configuration as that of FIGS. 1 to 4 may be omitted.

As shown in FIG. 5, the wiring layer 32 functioning as the select gate line SGS is provided above the semiconductor substrate (e.g., the p-type well regions) 33. Above the wiring layer 32, two layers of the wiring layers 31 functioning as the dummy word lines WLDS are stacked along the Z-direction. Above the two layers of the wiring layers 31, eight layers of the wiring layers 31 functioning as the word lines WL0~WL7 are stacked along the Z-direction. Above the eight layers of the wiring layers 31, two layers of the wiring layer 31 functioning as the dummy word lines WLDD are stacked along the Z-direction. The planar layouts of the wiring layers 31 and 32 are as described in FIG. 4. The wiring layer 30 functioning as the select gate line SGD is provided above the wiring layer 31. The planar layout of the wiring layer 30 is as described in FIG. 3. As described above, in the memory cell array 21, the select gate line SGS, the dummy word line WLDS, the wordline WL, the dummy word line WLDD, and the select gate line SGD are stacked above the semiconductor substrate, so that the memory cell transistor MT is three-dimensionally stacked.

Then, the slit SLT2 and the memory pillar MP are alternately provided along the Y-direction so as to reach the semiconductor substrate 33 from the wiring layer 30. The diameter of the memory pillar MP gradually decreases from the upper layer side toward the lower layer side, for example. As described above, the substance of the slit SLT2 is an insulating film. However, in the slit SLT2, a contact plug or the like for applying a voltage to an area provided in the semiconductor substrate 33 may be provided, or a contact plug for connecting the source of the selection transistor ST2 to the source line may be provided.

One of the wiring layers 32 adjacent to each other via the memory pillar MP function as the select gate line SGSo, and the other functions as the select gate line SGSe. Similarly, one of the dummy word lines WLDS of the wiring layers 31 adjacent to each other via the memory pillar MP functions as the word line WLDSe, and the other functions as the word line WLDSo. Similarly, one of the word lines WL of the wiring layers 31 adjacent to each other via the memory pillar MP functions as the word line WLe, and the other functions as the word line WLo. Similarly, one of the word lines WLDD of the wiring layers 31 adjacent to each other via the memory pillar MP functions as the word line WLDDe, and the other functions as the word line WLDDo.

Further, the slit SLT1 is provided between the block BLK adjacent to each other in the Y-direction. The substance of the slit SLT1 is also an insulating film. In the slit SLT1, a contact plug or the like may be provided for applying a voltage to an area provided in the semiconductor substrate 33. For example, the contact plug or the groove shaped conductors may be provided for connecting the source of the selection transistor ST2 to the source line. In addition, the width of the slit SLT1 along the Y direction is larger than the width of the slit SLT2 along the Y direction.

The contact plug 36 is provided on the memory pillar MP, and the wiring layer 35 functioning as the bit line BL is provided along the Y-direction so as to be commonly connected to the contact plug 36.

Figure 6:
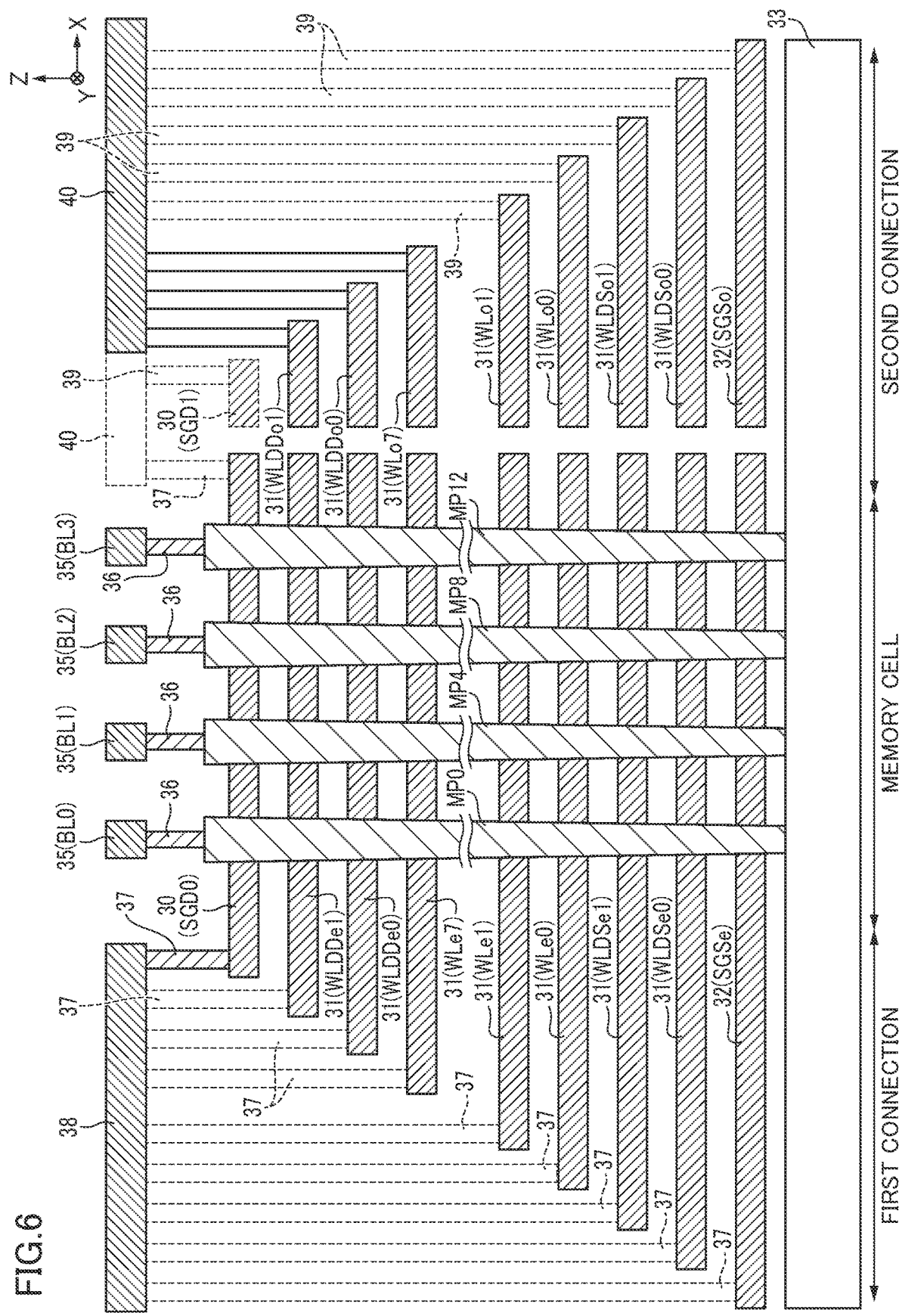
FIG. 6 is a cross-sectional view of an A1-A2 cut portion of the semiconductor memory device shown in FIGS. 3 and 4.

FIG. 6 is a cross-sectional view of the block BLK taken along the X-direction, illustrating the cross-sectional configuration of the regions along the select gate line SGD1 and passing through the memory pillar MP0, MP4, MP8 and MP12 in FIG. 3. FIG. 6 is a cross-sectional view of an A1-A2 cut portion of the semiconductor memory device shown in FIG. 3. The wiring layer 32, 31, and 30 are sequentially provided above the semiconductor substrate 33 as described with reference to FIG. 5. The memory cell is as described with reference to FIG. 5. In addition, in FIG. 6, a configuration present in the depth direction of the cross-sectional view of the A1-A2 cut portion is drawn by a dotted line.

As shown in FIG. 6, in the first connection, the wiring layer 30 to 32 are drawn out in a stepped shape, for example. That is, when viewed in the XY plane, in the first connection, each of the wiring layers 30 to 32 has a terrace part that does not overlap with the wiring layer of the upper layer. The contact plug 37 is provided on the terrace section, and the contact plug 37 is connected to the metal wiring layer 38. The metal wiring layer 38 electrically connects the even select gate lines SGD0, SGD2, SGD4 and SGD6, the even dummy word lines WLDDe, the even word line WLe, the even dummy word lines WLDSe, and the wiring layers 30 to 32 functioning as the even select gate lines SGSe to the even-numbered word line driver 28A via the row decoder 29 (FIG. 1).

On the other hand, in the second connection, the wiring layer 30 to 32 are likewise drawn out in a stepped manner, for example. That is, when viewed in the XY plane, in the second connection, each of the wiring layers 30 to 32 has a terrace part that does not overlap with the wiring layer of the upper layer. The contact plug 39 is provided on the terrace section, and the contact plug 39 is connected to the metal wiring layer 40. The metal wiring layer 40 electrically connects the odd select gate lines SGD1, SGD3, SGD5 and SGD7, the odd dummy word lines WLDDo, the odd word line WLo, the odd dummy word line WLDSo, and the wiring layers 31 and 32 functioning as the odd select gate lines SGSo to the odd-numbered word line driver 28B via the row decoder 29 (FIG. 1). Note that the wiring layer 30 may be electrically connected to the row decoder 29 via the second connection instead of the first connection. In addition, the wiring layer 30 may be connected via both of the first connection and the second connection.

Figure 7:
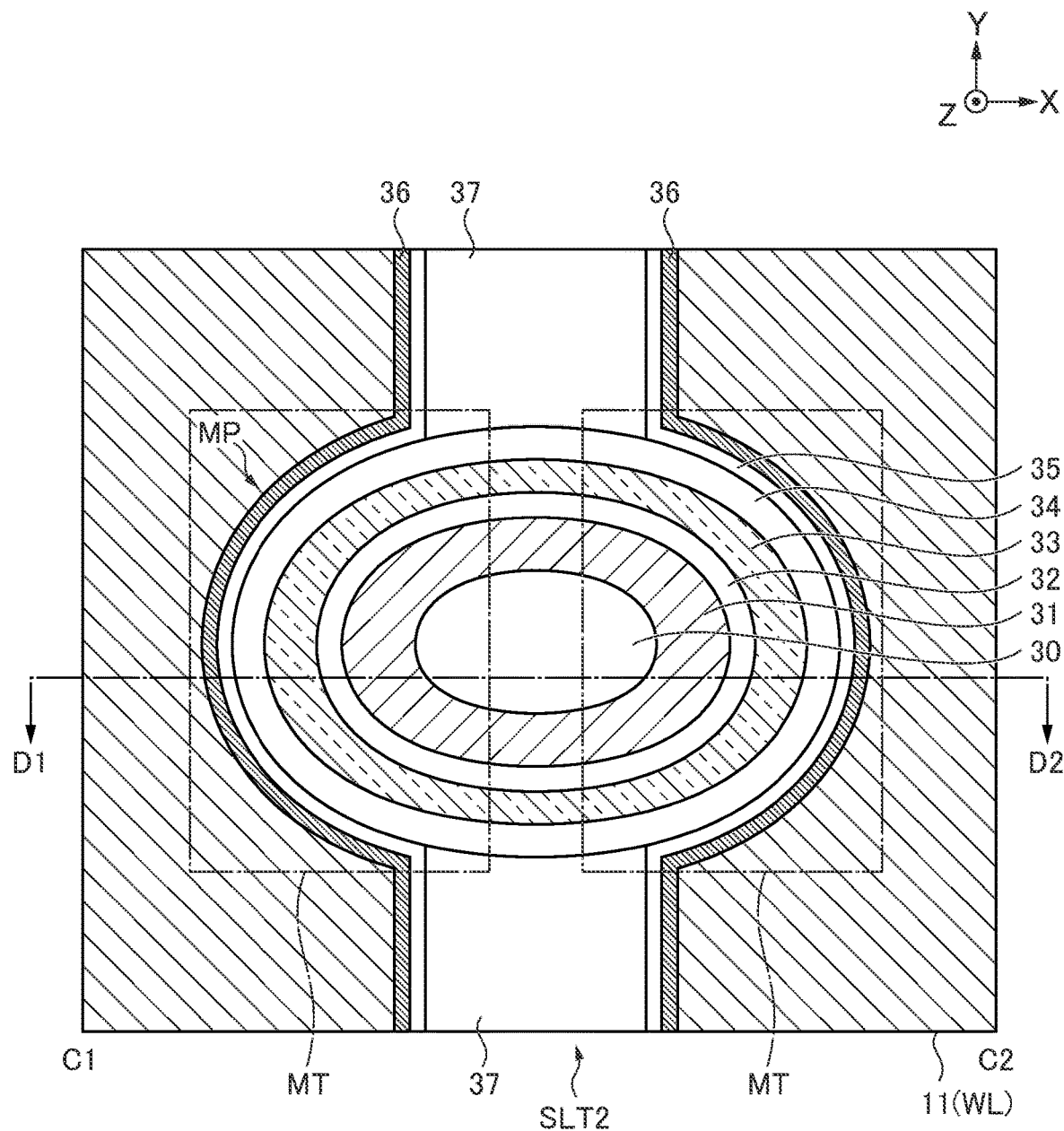
FIG. 7 is a cross-sectional view of a C1-C2 cut portion of a memory cell transistor shown in FIG. 5.
Figure 8:
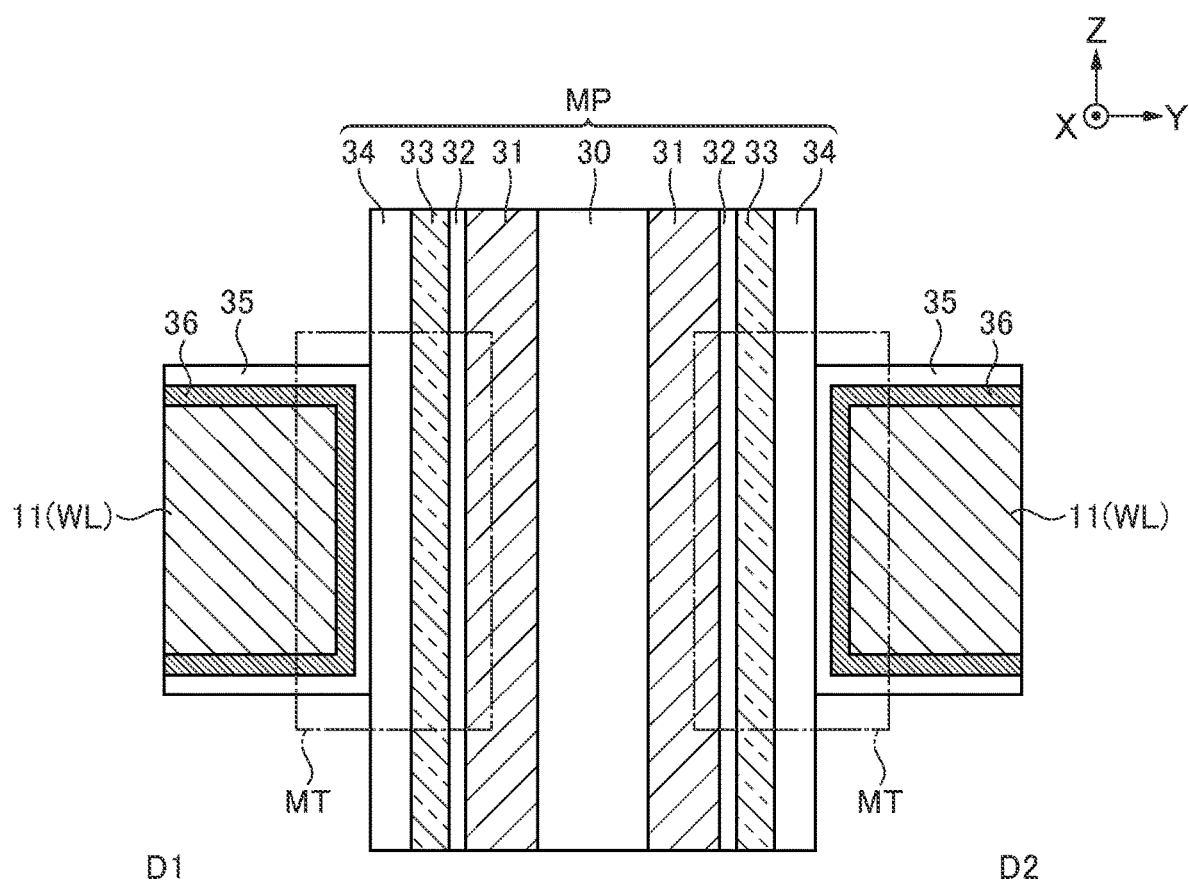
FIG. 8 is a cross-sectional view of a D1-D2 cut portion of the memory cell transistor shown in FIG. 7.

FIG. 7 is a cross-sectional view of a C1-C2 cut portion of the memory cell transistor according to embodiments, and FIG. 8 is a cross-sectional view of a D1-D2 cut portion of the memory cell transistor shown in FIG. 7. FIGS. 7 and 8 are cross-sectional views of cut portions, each of which shows a region including two memory cell transistors MT. In the first example, the charge storage layer included in the memory cell transistor MT is an insulating film. The first example of the memory cell transistor according to embodiments is not limited to the structures shown in FIGS. 7 and 8. In the description of FIGS. 7 and 8, the description of the same or similar configuration as that of FIGS. 1 to 6 may be omitted.

As shown in FIGS. 7 and 8, the memory pillar MP includes the insulating layer 30 (an exemplary insulator), the semiconductor layer 31, and the insulating layers 32 to 34 provided along the Z-direction. The insulating layer 30 is formed by using, for example, a silicon oxide film. The semiconductor layer 31 is provided so as to surround the insulating layer 30, and functions as a region in which a channel of the memory cell transistor MT is formed. The semiconductor layer 31 (an exemplary first channel and second channel) is formed by using, for example, a polycrystalline silicon layer. The semiconductor layer 31 is not separated between the memory cell transistors MT in the same memory pillar MP, but is provided continuously. Therefore, the channels formed in the two memory cell transistors MT share a part of the memory pillar MP.

As described above, the semiconductor layer 31 is continuous between the two memory cell transistors MT facing each other. Therefore, the channels formed in the two memory cell transistors MT facing each other share a part of the memory pillar MP. Specifically, in FIGS. 7 and 8, in the left memory cell transistor MT and the right memory cell transistor MT facing each other, the channel formed in the first memory cell and the channel formed in the second memory cell share a part of the memory pillar MP. Here, the fact that the two channels share a part of the memory pillar MP means that the two channels are formed in the same memory pillar MP and the two channels partially overlap. In embodiments, in the above configuration, the two memory cell transistors MT may share the channel, or the two memory cell transistors MT may face each other.

The insulating layer 32 is provided so as to surround the semiconductor layer 31, and functions as a gate insulating film of the memory cell transistor MT. The insulating layer 32 is formed by using, for example, a stacked structure of a silicon oxide film and a silicon nitride film. The insulating layer 33 is provided so as to surround the semiconductor layer 31, and functions as a charge storage layer of the memory cell transistor MT. The insulating layer 33 is formed by using, for example, a silicon nitride film. The insulating layer 34 is provided so as to surround the insulating layer 33, and functions as a block insulating film of the memory cell transistor MT. The insulating layer 34 is formed by using, for example, a silicon oxide film. The insulating layer 37 is embedded in the slit SLT2 excluding the memory pillar MP portion. The insulating layer 37 is formed by using, for example, a silicon oxide film. The insulating layer 33 of the memory cell transistor MT on the left side and the insulating layer 33 of the memory cell transistor MT on the right side facing each other are connected by, for example, the insulating layer 33 including a silicon nitride film.

In the first example of embodiments, for example, an AlO layer 35 is provided around the memory pillar MP. For example, a barrier metal layer 36 is provided around the AlO layer 35. The barrier metal layer 36 is formed by using, for example, a TiN film. The wiring layer 11 that functions as the word line WL is provided around the barrier metal layer 36. The wiring layer 11 is formed by using, for example, a film formed of tungsten.

Therefore, one memory pillar MP includes two memory cell transistors MT and MT or two selection transistors ST1 and ST2 along the Y direction at a predetermined position on the Z axis.

1-6-2. Example 2

Figure 9:
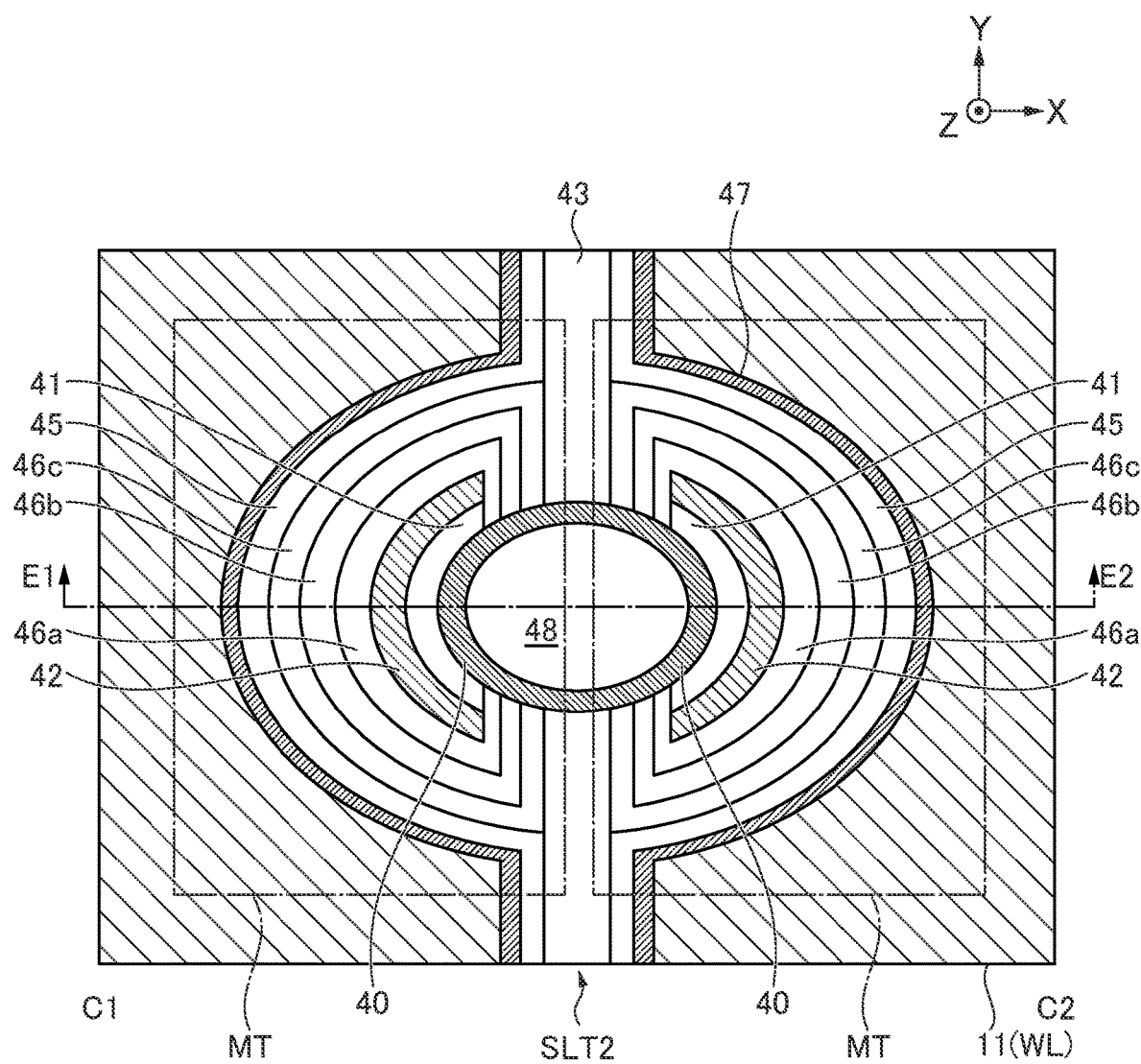
FIG. 9 is a cross-sectional view of a cut portion showing a modification example of the memory cell transistor shown in FIG. 7.
Figure 10:
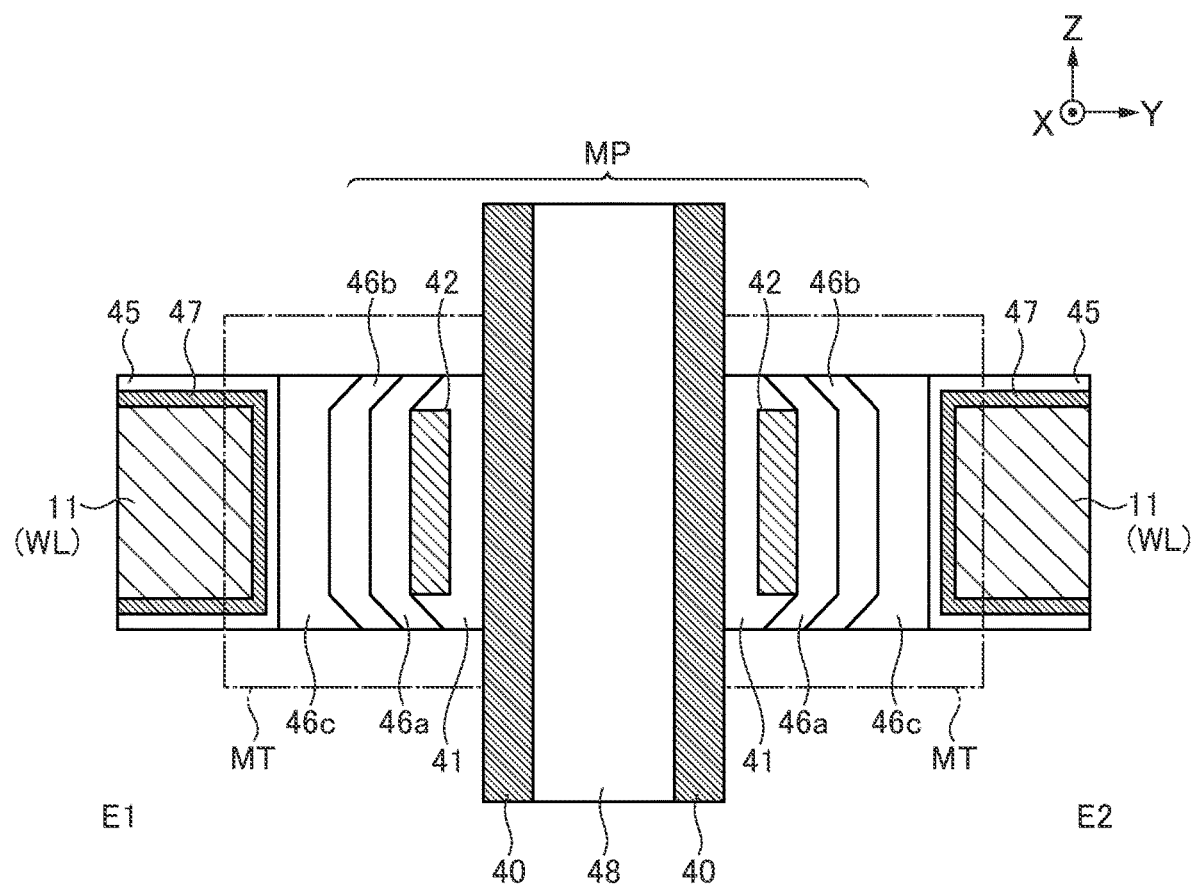
FIG. 10 is a cross-sectional view of an E1-E2 cut portion of the memory cell transistor shown in FIG. 9.
Figure 11:
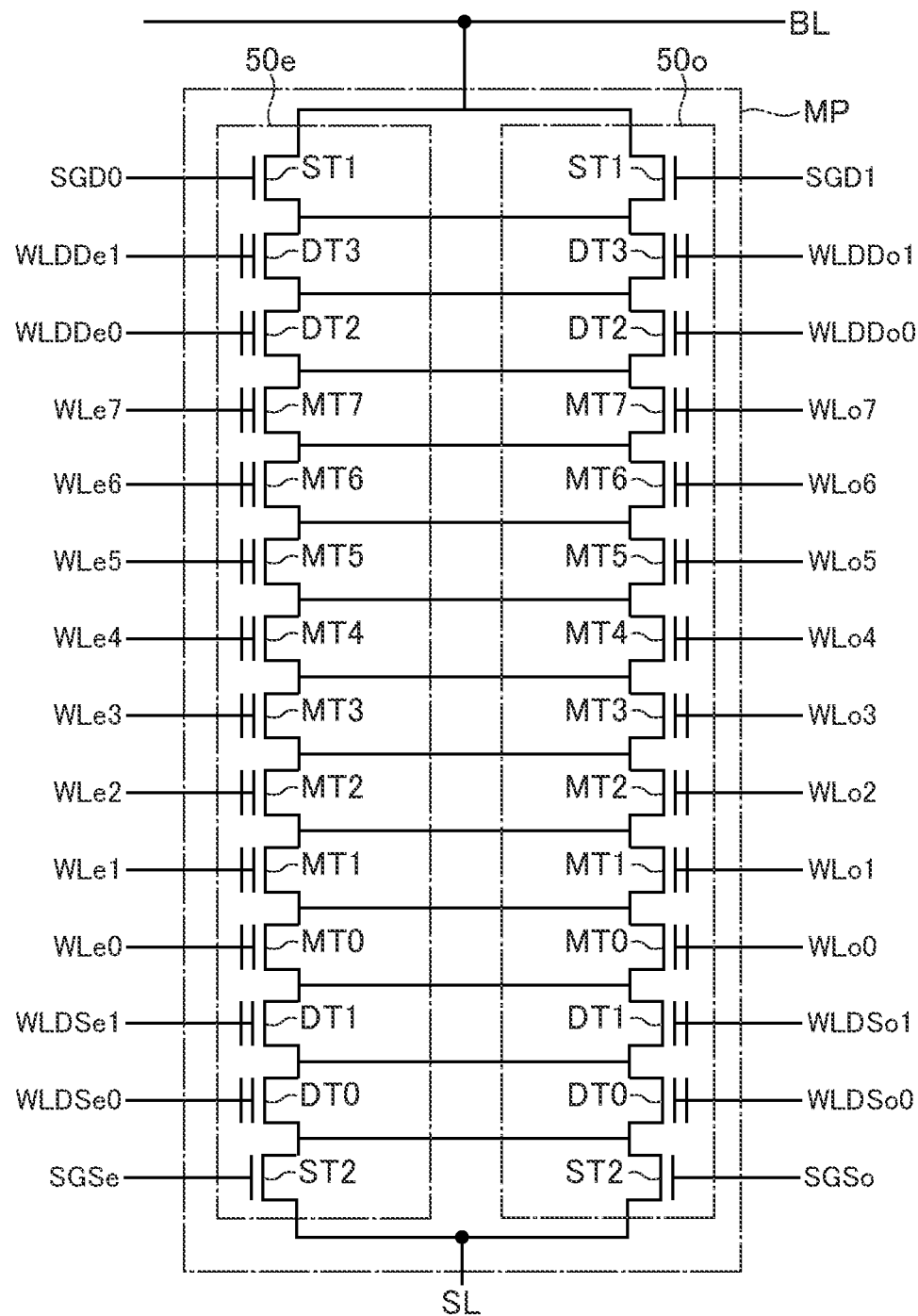
FIG. 11 is a diagram showing an equivalent circuit of a memory pillar (two NAND strings adjacent to each other) in the semiconductor memory device according to the first embodiment.

FIG. 9 is a diagram showing a modification example of the memory cell transistor shown in FIG. 7, and is a cross-sectional view of a C1-C2 cut portion of the memory cell transistor shown in FIG. 5. FIG. 10 is a cross-sectional view of an E1-E2 cut portion of the memory cell transistor shown in FIG. 9. FIGS. 9 and 10 are cross-sectional views of cut portions, each of which shows a region including two memory cell transistors MT. In the second example, the charge storage layer included in the memory cell transistor MT is a conductive film. The second embodiment of the memory cell transistor according to an embodiment is not limited to the construction shown in FIG. 10. In the description of FIGS. 10 and 11, the description of the same or similar configuration as that of FIGS. 1 to 9 may be omitted.

As shown in FIGS. 10 and 11, the memory pillar MP includes an insulating layer 48 and an insulating layer 43, a semiconductor layer 40, an insulating layer 41, a conductive layer 42, and insulating layers 46a to 46c, all of which are provided along the Z direction. The insulating layer 48 is formed by using, for example, a silicon oxide film. The semiconductor layer 40 is provided so as to surround the insulating layer 48. The semiconductor layer 40 functions as a region in which a channel of the memory cell transistor MT is formed. The semiconductor layer 40 is formed by using, for example, a polycrystalline silicon layer. As in the first example of the memory pillar MP shown in FIG. 8, the semiconductor layer 40 is not separated between the memory cell transistors MT in the same memory pillar MP, but is provided continuously.

The insulating layer 41 is provided around the semiconductor layer 40 and functions as a gate insulating film of each memory cell transistor MT. The insulating layer 41 is separated into two regions within the XY plane shown in FIG. 10. Each of the insulating layers 41 obtained as a result of separation into two regions functions as a gate insulating film of each of the two memory cell transistors MT in the same memory pillar MP. The insulating layer 41 is formed by using, for example, a stacked structure of a silicon oxide film and a silicon nitride film.

The conductive layer 42 is provided around the insulating layer 41 and is separated into two regions along the Y direction by the insulating layer 43. Each of the conductive layers 42 obtained as a result of separation into two regions functions as a charge storage layer of each of the two memory cell transistors MT. The conductive layer 42 is formed by using, for example, a polycrystalline silicon layer.

The insulating layer 43 is formed by using, for example, a silicon oxide film. Around the conductive layer 42, the insulating layers 46a, 46b, and 46c are provided sequentially from the side close to the conductive layer 42. The insulating layers 46a and 46c are formed by using, for example, a silicon oxide film, and the insulating layer 46b is formed by using, for example, a silicon nitride film. Each of the insulating layers 46a, 46b, and 46c functions as a block insulating film of the memory cell transistor MT. Each of the insulating layers 46a, 46b, and 46c is separated into two regions along the Y direction. The insulating layer 43 is provided between the insulating layers 46c obtained as a result of separation into two regions. In addition, the insulating layer 43 is embedded in the slit SLT2. The insulating layer 43 is formed by using, for example, a silicon oxide film.

In the second example of embodiments, for example, an AlO layer 45 is provided around the memory pillar MP. For example, a barrier metal layer 47 is provided around the AlO layer 45. The barrier metal layer 47 is formed by using, for example, a TiN film. The wiring layer 11 that functions as the word line WL is provided around the barrier metal layer 47. As in the first example of the memory pillar MP according to embodiments, the wiring layer 11 in the second example of the memory pillar MP according to embodiments is formed by using, for example, a film formed of tungsten.

Also in the second example of the memory pillar MP according to embodiments, as in the first example of the memory pillar MP, one memory pillar MP includes two memory cell transistors MT and MT or two selection transistors ST1 and ST2 along the Y direction at a predetermined position on the Z axis. In addition, although not shown, an insulating layer is provided between the memory cell transistors adjacent to each other in the Z direction. By the insulating layer, the insulating layer 43, and the insulating layer 46, the conductive layer 42 is insulated for each individual memory cell transistor.

FIG. 11 is an equivalent circuit diagram of a memory pillar (two NAND strings adjacent to each other) in the semiconductor memory device 1 according to embodiments. The equivalent circuit diagram of the memory pillar according to embodiments is not limited to the equivalent circuit diagram shown in FIG. 11. In the description of FIG. 11, the description of the same or similar configuration as that of FIGS. 1 to 10 may be omitted.

As shown in FIG. 11, two NAND strings 50*e* and 50*o* are formed in one memory pillar MP. Each of the NAND string 50*e* (an example of the substring) and 50*o* (an example of the substring) has the selection transistor ST1, dummy transistors DT0 and DT1, the memory cell transistors MT0 to MT7, dummy transistors DT2 and DT3 and the selection transistor ST2 electrically connected in series. The NAND string 50*e* and the NAND string 50*o* are provided so as to face each other. Therefore, the selection transistor ST1, the dummy transistors DT0 and DT1, the memory cell transistors MT0 to MT7, dummy transistors DT2 and DT3 and the selection transistor ST2 included in the NAND string 50*e* are provided so as to face the selection transistor ST1, the dummy transistors DT0 and DT1, the memory cell transistors MT0 to MT7, dummy transistors DT2 and DT3 and the selection transistor ST2 included in the NAND string 50*o* each other one-on-one. Specifically, the selection transistor ST1 included in the NAND string 50*e* and the selection transistor ST1 included in the NAND string 50*o* are provided to face each other, the dummy transistors DT0 and DT1 included in the NAND string 50*e* and the dummy transistors DT0 and DT1 included in the NAND string 50*o* are provided to face each other one-on-one, the memory cell transistors MT0 to MT7 included in the NAND string 50*e* and the memory cell transistors MT0 to MT7 included in the NAND string 50*o* are provided to face each other one-on-one, the dummy transistors DT2 and DT3 included in the NAND string 50*e* and the dummy transistors DT2 and DT3 included in the NAND string 50*o* are provided to face each other one-on-one, and the selection transistor ST2 included in the NAND string 50*e* and the selection transistor ST2 included in the NAND string 50*o* are provided to face each other.

In the following description, an example including two memory pillars MP, that is, a first memory pillar MP (for example, MP4 in FIG. 4) and a second memory pillar MP (for example, MP0 in FIG. 4) adjacent to the first memory pillar MP will be mainly described.

The selection transistor ST1 of the NAND string 50*e* provided in each of the first memory pillar MP and the second memory pillar MP is connected to, for example, the common select gate line SGD0. The selection transistor ST1 of the NAND string 50*o* provided in each of the first memory pillar MP and the second memory pillar MP is connected to, for example, the common select gate line SGD1. The dummy transistors DT2 and DT3 of the NAND string 50*e* provided in each of the first memory pillar MP and the second memory pillar MP are connected to the common dummy word lines WLDDe0 and WLDDe1, respectively. The dummy transistors DT2 and DT3 of the NAND string 50*o* provided in each of the first memory pillar MP and the second memory pillar MP are connected to the common dummy word lines WLDDo0 and WLDDo1, respectively. The memory cell transistors MT0 to MT7 of the NAND string 50*e* provided in each of the first memory pillar MP and the second memory pillar MP are connected to the common word lines WLe0 to WLe7, respectively. The memory cell transistors MT0~MT7 of the NAND string 50*o* provided in each of the first memory pillar MP and the second memory pillar MP are connected to the common word lines WLo0~WLo7, respectively. The dummy transistors DT0 and DT1 of the NAND string 50*e* provided in each of the first memory pillar MP and the second memory pillar MP are connected to the common dummy word lines WLDSe0 and WLDSe1, respectively. The dummy transistors DT0 and DT1 of the NAND string 50*o* provided in each of the first memory pillar MP and the second memory pillar MP are connected to the common dummy word lines WLDSo0 and WLDSo1, respectively. The selection transistor ST2 of the NAND string 50*e* provided in each of the first memory pillar MP and the second memory pillar MP is connected to, for example, the common even numbered select gate line SGSe. The selection transistor ST2 of the NAND string 50*o* provided in each of the first memory pillar MP and the second memory pillar MP is connected to, for example, the common odd-numbered select gate line SGSo.

As described above, the selection transistor ST1, the dummy transistors DT2 and DT3, the memory cell transistors MT0 to MT7, the dummy transistors DT0 and DT1, and the selection transistor ST2 included in the NAND string 50*e* and the selection transistor ST1, the dummy transistors DT2 and DT3, the memory cell transistors MT0 to MT7, the dummy transistors DT0 and DT1, and the selection transistor ST2 included in the NAND string 50*o* correspond to each other. In the two transistors facing each other, the sources are electrically connected to each other and the drains are electrically connected to each other. Specifically, in the NAND strings 50*e* and 50*o*, the sources and the drains of the opposing selection transistors ST1 are electronically connected to each other, the sources and the drains of the opposing dummy transistor DT3 are electrically connected to each other, the sources and the drains of the opposing dummy transistor DT2 are electrically connected to each other, the sources and the drains of the opposing the memory cell transistor MT0-7 are electrically connected to each other, the sources and the drains of the opposing dummy transistor DT1 are electrically connected to each other, the sources and the drains of the opposing dummy transistor DT0 are electrically connected to each other, and the sources and the drains of the opposing selection transistor ST2 are electrical connected to each other. This is because the channels formed in the transistors facing each other share a part of the memory pillar MP.

The two NAND strings 50*e* and 50*o* in the same memory pillar MP are connected to the same bit line BL and the same source line SL.

How the select gate line SGD is selected will be described with reference to FIGS. 3 and 4. When one of the select gate lines SGD0 to SGD3 is selected, a voltage for turning on the selection transistor ST1 is supplied to one of the wiring layers 10-0 to 10-3 corresponding to the select gate lines. For example, when the wiring layer 10-1 is selected, eight selection transistors ST1 provided in the memory pillars MP0, MP1, MP4, MP5, MP8, MP9, MP12, and MP13 are turned on. As a result, eight memory cell transistors MT belonging to the above memory pillars are selected. That is, one page is formed by the above eight memory cell transistors MT. Since the operation when a wiring layer other than the wiring layer 10-1 is selected is the same as the above, the description will be omitted.

In embodiments, for example, the TLC method is applied as a writing method of the memory cell transistor MT. A plurality of memory cell transistors MT to which the TLC method is applied form eight threshold distributions (write levels). The eight threshold distributions are referred to as, for example, "Er" level, "A" level, "B" level, "C" level, "D" level, "E" level, "F" level, and "G" level in order from the lowest threshold voltage. Different 3-bit data is assigned to "Er" level, "A" level, "B" level, "C" level, "D" level, "E" level, "F" level, and "G" level.

The semiconductor memory device 1 according to embodiments repeatedly executes a program loop in the write operation. The program loop includes, for example, a program operation and a verify operation. The program operation is an operation of increasing the threshold voltage of the selected memory cell transistor MT by injecting electrons into the charge storage layer in the selected memory cell transistor MT. Alternatively, the program operation is an operation of maintaining the threshold voltage of the selected memory cell transistor MT by prohibiting the injection of electrons into the charge storage layer. The verify operation is an operation of checking whether or not the threshold voltage of the selected memory cell transistor MT has reached the target level by a read operation using the verify voltage subsequent to the program operation. The selected memory cell transistor MT whose threshold voltage has reached the target level is then write-protected.

In the semiconductor memory device 1 according to embodiments, the threshold voltage of the selected memory cell transistor MT is increased to the target level by repeatedly executing the program loop including the program operation and the verify operation described above.

The electrons stored in the charge storage layer may be stored in an unstable state. Therefore, from the time when the above-described program operation is completed, the electrons stored in the charge storage layer of the memory cell transistor MT may escape from the charge storage layer with the passage of time. When the electrons escape from the charge storage layer, the threshold voltage of the memory cell transistor MT decreases. Therefore, in the read operation executed after the write operation is completed, in order to cope with such a decrease in the threshold voltage of the memory cell transistor that may occur with the passage of time, the read operation is performed using a read voltage lower than the verify voltage. The read operation may include a verify operation.

Figure 13:
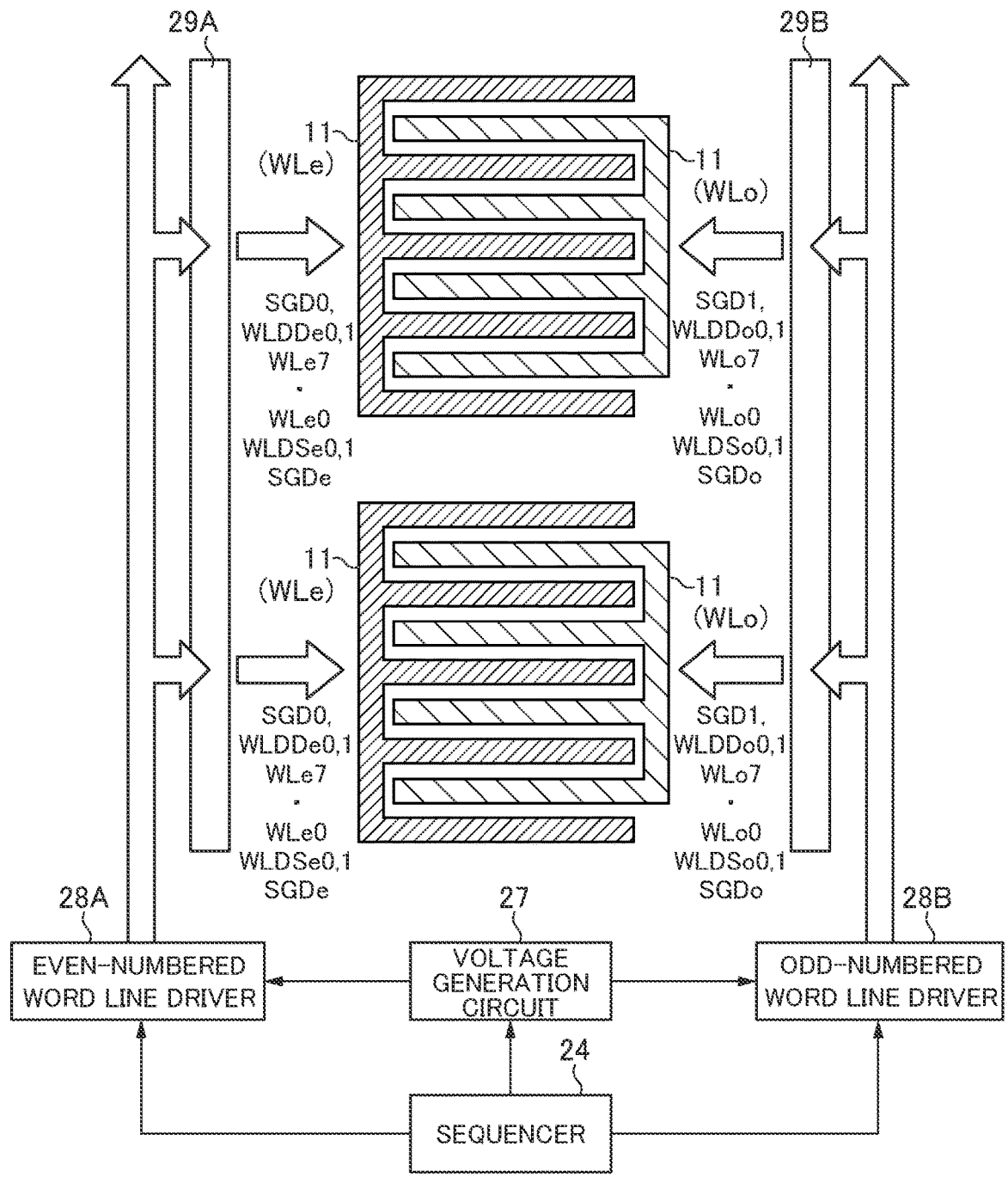
FIG. 13 is a diagram for explaining the electrical connection of a voltage generation circuit, a driver set, a select gate line, or a word line according to the first embodiment.

FIGS. 12 and 13 are diagrams for explaining the electrical connection of the sequencer 24, the voltage generation circuit 27, the driver set 28, the row decoder 29, the select gate line SGD or the word line WL according to embodiments. The sequencer 24, the voltage generation circuit 27, the driver set 28, the row decoder 29, the select gate line SGD or the word line WL according to the present embodiment is not limited to the plane shown in FIG. 12. In the description of FIGS. 12 and 13, the description of the same or similar configuration as that of FIGS. 1 to 11 may be omitted. A circuit including the sequencer 24, the voltage generation circuit 27, the driver set 28, and the row decoder 29 is an example of a control circuit.

As shown in FIG. 12, the wiring layer 11 that functions as the even-numbered word line WLe may be connected to the even side driver 28A, and the wiring layer 11 that functions as the odd-numbered word line WLo may be electrically connected to the odd side driver 28B. As described above, the even side driver 28A and the odd side driver 28B are included in the driver set 28. The driver set 28 is electrically connected to the voltage generation circuit 27. As shown in FIGS. 12 and 13, the even side driver 28A and the odd side driver 28B may generate various voltages using the voltage supplied from the voltage generation circuit 27. Then, the even side driver 28A may supply the generated voltage to the even-numbered word line WLe of each block BLK through the row decoder 29A. In addition, the odd side driver 28B may supply the generated voltage to the odd-numbered word line WLo of each block BLK through the row decoder 29B. The row decoder 29A and the row decoder 29B are included in the row decoder 29.

As shown in FIG. 13 and as described above, the sequencer 24 can execute various operations, such as a write operation and a read operation, by controlling the driver set 28 and the like.

Figure 14:
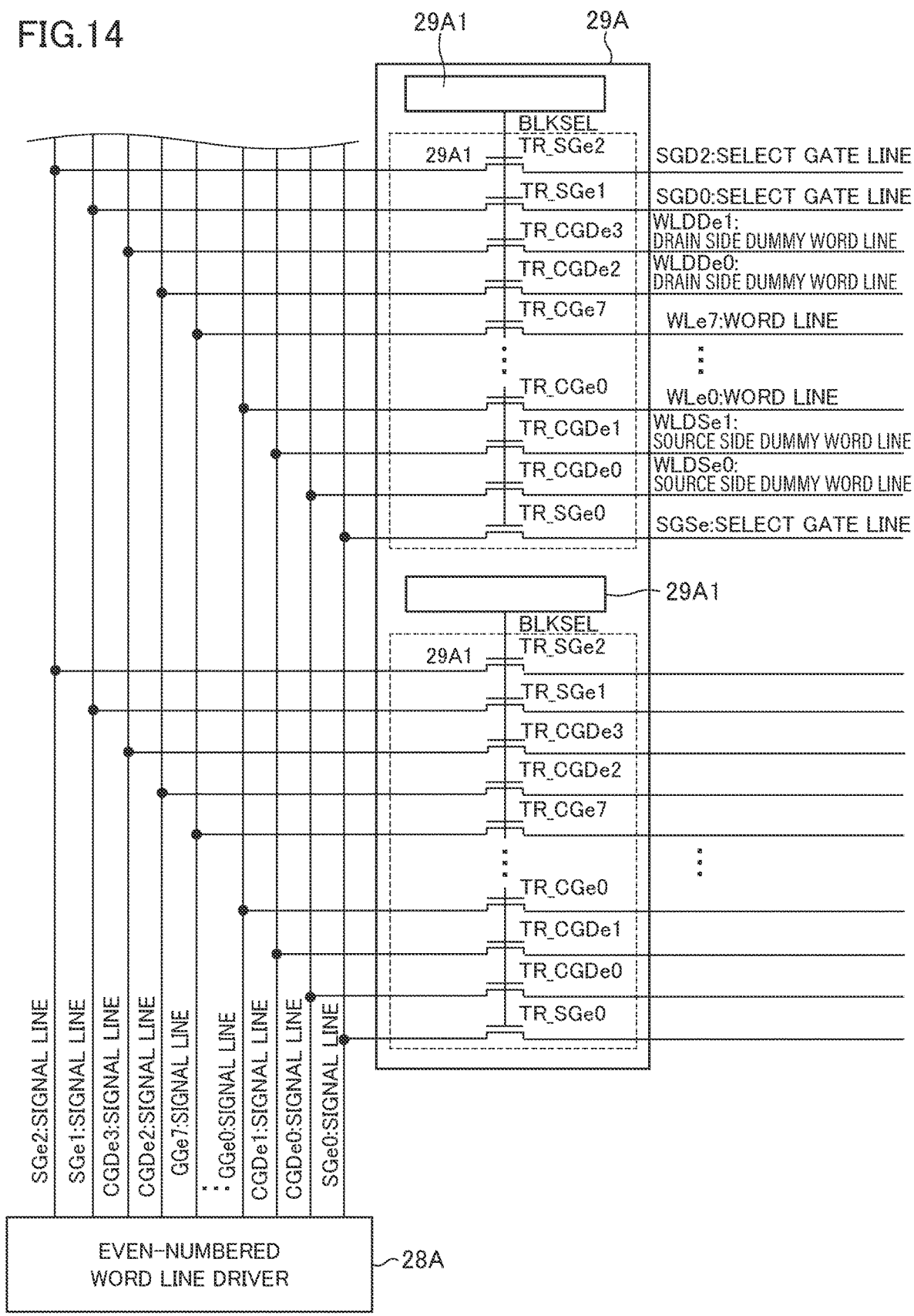
FIG. 14 is a schematic diagram for explaining an electric connection between even-numbered word line drivers and row decoder according to the first embodiment.

FIG. 14 is a schematic diagram for explaining the electrical connection between the even side driver 28A and the row decoder 29A according to embodiments.

A signal line SGe0, a signal line SGe1, a signal line SGe2, a signal line CGDe0, a signal line CGDe1, a signal line CGDe2, a signal line CGDe3, and signal lines CGe0, ..., CGe7 as signal lines CGe are connected to the even side driver 28A. In addition, as for the signal line CGe, for example, as many signal lines CGe as the number of even-numbered word lines WL arranged in the Z direction in the block BLK are connected.

The signal line SGe0 is connected to the even-numbered select gate line SGSe in each block BLK through a transistor TR_SGe0. The transistor TR_SGe0 functions as a switch for turning on/off the signal from the signal line SGe0 using a block decoder 29A1.

The signal lines CGDe0 and CGDe1 are connected to the even-numbered dummy word lines WLDSe0 and WLDSe1 in each block BLK through transistors TR_CGDe0 and TR_CGDe1, respectively. The transistors TR_CGDe0 and TR_CGDe1 function as switches for turning on/off the signals from the signal lines CGDe0 and CGDe1 using the block decoder 29A1.

The signal lines CGe0, ..., CGe7 are connected to the even-numbered word lines WLe0, ..., WLe7 in each block BLK through transistors TR_CGe0, ..., TR_CGe7, respectively. The transistors TR_CGe0, ..., TR_CGe7 function as switches for turning on/off the signals from the signal lines CGe0, ..., CGe7 using the block decoder 29A1.

The signal lines CGDe2 and CGDe3 are connected to the even-numbered dummy word lines WLDDe0 and WLDDe1 in each block BLK through transistors TR_CGDe2 and TR_CGDe3, respectively. The transistors TR_CGDe2 and TR_CGDe3 function as switches for turning on/off the signals from the signal lines CGDe2 and CGDe3 using the block decoder 29A1.

The signal line SGe1 is connected to the select gate line SGD0 in each block BLK through a transistor TR_SGe1. The transistor TR_SGe1 functions as a switch for turning on/off the signal from the signal line SGe1 using the block decoder 29A1.

The signal line SGe2 is connected to the select gate line SGD2 in each block BLK through a transistor TR_SGe2.

The transistor TR_SGe2 functions as a switch for turning on/off the signal from the signal line SGe2 using the block decoder 29A1.

Figure 15:
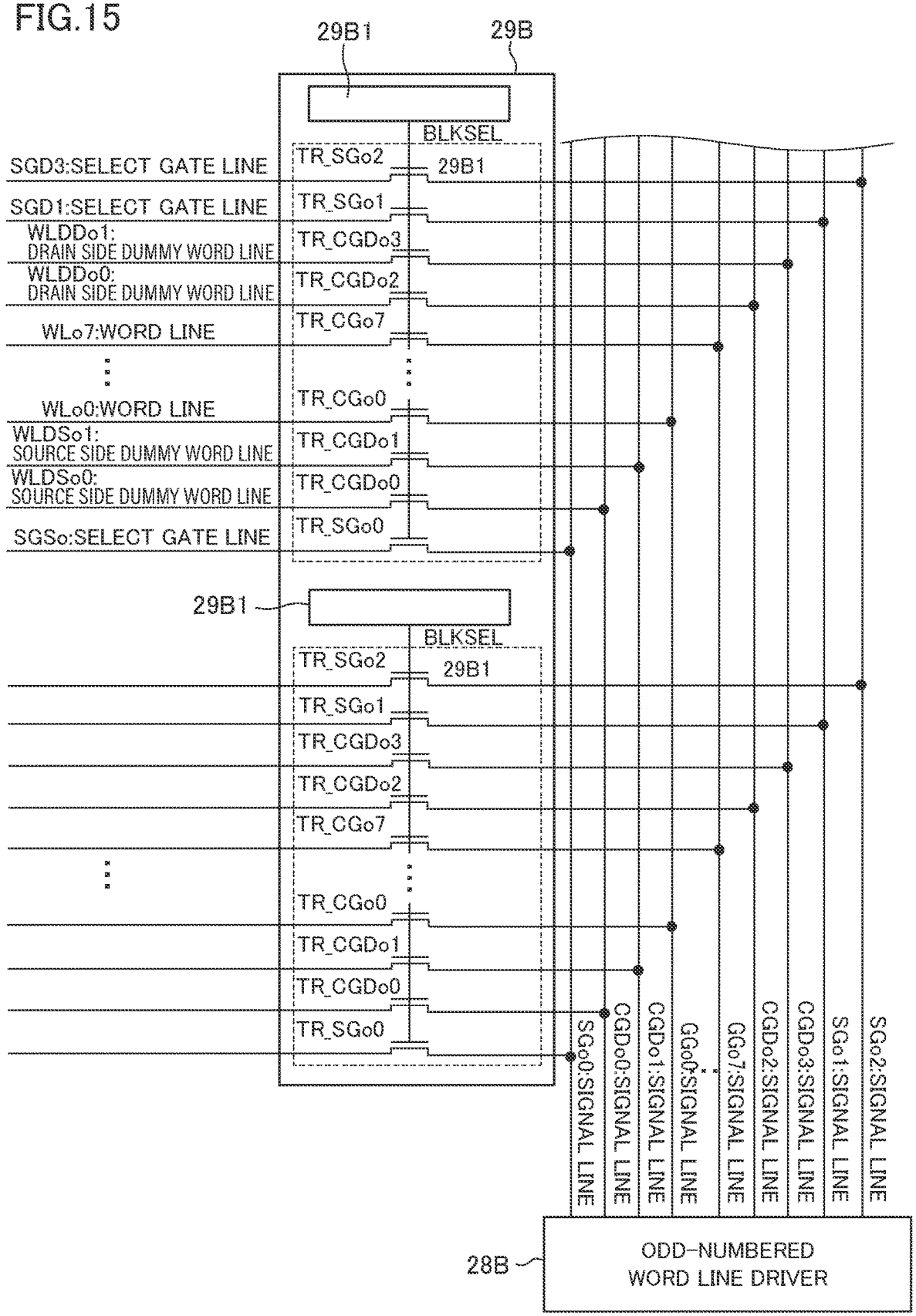
FIG. 15 is a schematic diagram for explaining an electric connection between odd-numbered word line drivers and row decoder according to the first embodiment.

FIG. 15 is a schematic diagram for explaining the electrical connection between the odd side driver 28B and the row decoder 29B according to embodiments.

The odd-numbered word line driver 28 is connected to the signal line SGo0, the signal line SGo1, the signal line SGo2, the signal line CGDo0, the signal line CGDo1, the signal line CGDo2, the signal line CGDo3 and the signal line CGo as the signal lines CGo0 . . . CGo7. In addition, as for the signal line CGo, for example, as many signal lines CGo as the number of odd-numbered word lines WL arranged in the Z direction in the block BLK are connected.

The signal line SGo0 is connected to the odd-numbered select gate line SGSo in each block BLK through a transistor TR_SGo0. The transistor TR_SGo0 functions as a switch for turning on/off the signal from the signal line SGo0 using a block decoder 29B1.

The signal lines CGDo0 and CGDo1 are connected to the odd-numbered the dummy word lines WDLSo0 and WLDSo1 in the respective block BLK via the transistors TR_CGDo0 and TR_CGDo1. The transistors TR_CGDo0 and TR_CGDo1 function as switches for turning on/off the signals from the signal lines CGDo0 and CGDo1 using the block decoder 29B1.

The signal lines CGo0, . . . , CGo7 are connected to the odd-numbered word lines WLo0, . . . , WLo7 in each block BLK through transistors TR_CGo0, . . . , TR_CGo7, respectively. The transistors TR_CGo0, . . . , TR_CGo7 functions as switches for turning on/off the signals from the signal lines CGo0, . . . , CGo7 using the block decoder 29B1.

The signal lines CGDo2 and CGDo3 are connected to the odd-numbered dummy word lines WLDDo0 and WLDDo1 in each block BLK through transistors TR_CGDo2 and TR_CGDo3, respectively. The transistors TR_CGDo2 and TR_CGDo3 function as switches for turning on/off the signals from the signal lines CGDo2 and CGDo3 using the block decoder 29B1.

The signal line SGo1 is connected to the select gate line SGD1 in each block BLK through a transistor TR_SGo1. The transistor TR_SGo1 functions as a switch for turning on/off the signal from the signal line SGo1 using the block decoder 29B1.

The signal line SGo2 is connected to the select gate line SGD3 in each block BLK through a transistor TR_SGo2. The transistor TR_SGo1 functions as a switch to turn on/off the signals from the signal line SGo2 by the block decoder 29B1.

Figure 16:
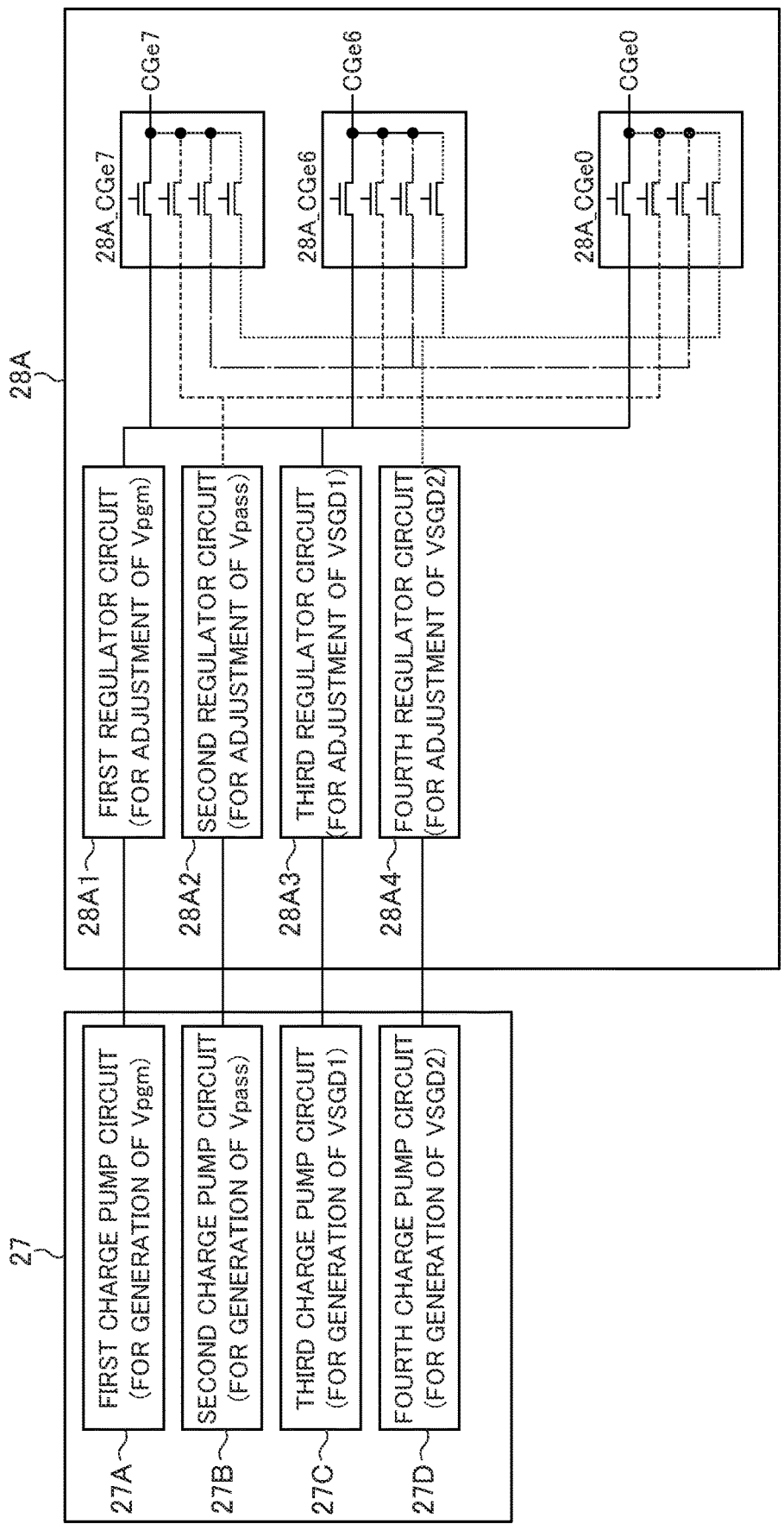
FIG. 16 is a schematic diagram for explaining the electric connectivity between the voltage generation circuit 27 and the even-numbered word line driver 28 according to the first embodiment.

FIG. 16 is a schematic diagram for explaining the electrical connection between the voltage generation circuit 27 and the even side driver 28A according to embodiments.

Voltages Vpgm, Vpass, VSGD1, and VSGD2, which will be described later, are generated by, for example, a first charge pump circuit 27A, a second charge pump circuit 27B, a third charge pump circuit 27C, and a fourth charge pump circuit 27D in the voltage generation circuit 27, respectively. Then, the voltages Vpgm, Vpass, VSGD1, and VSGD2 are held by a first regulator circuit 28A1, a second regulator circuit 28A2, a third regulator circuit 28A3, and a fourth regulator circuit 28A4 in the even side driver 28A, respectively. Then, the voltages Vpgm, Vpass, VSGD1, and VSGD2 are appropriately added and supplied to the signal lines CGe0, . . . , CGe7.

Figure 17:
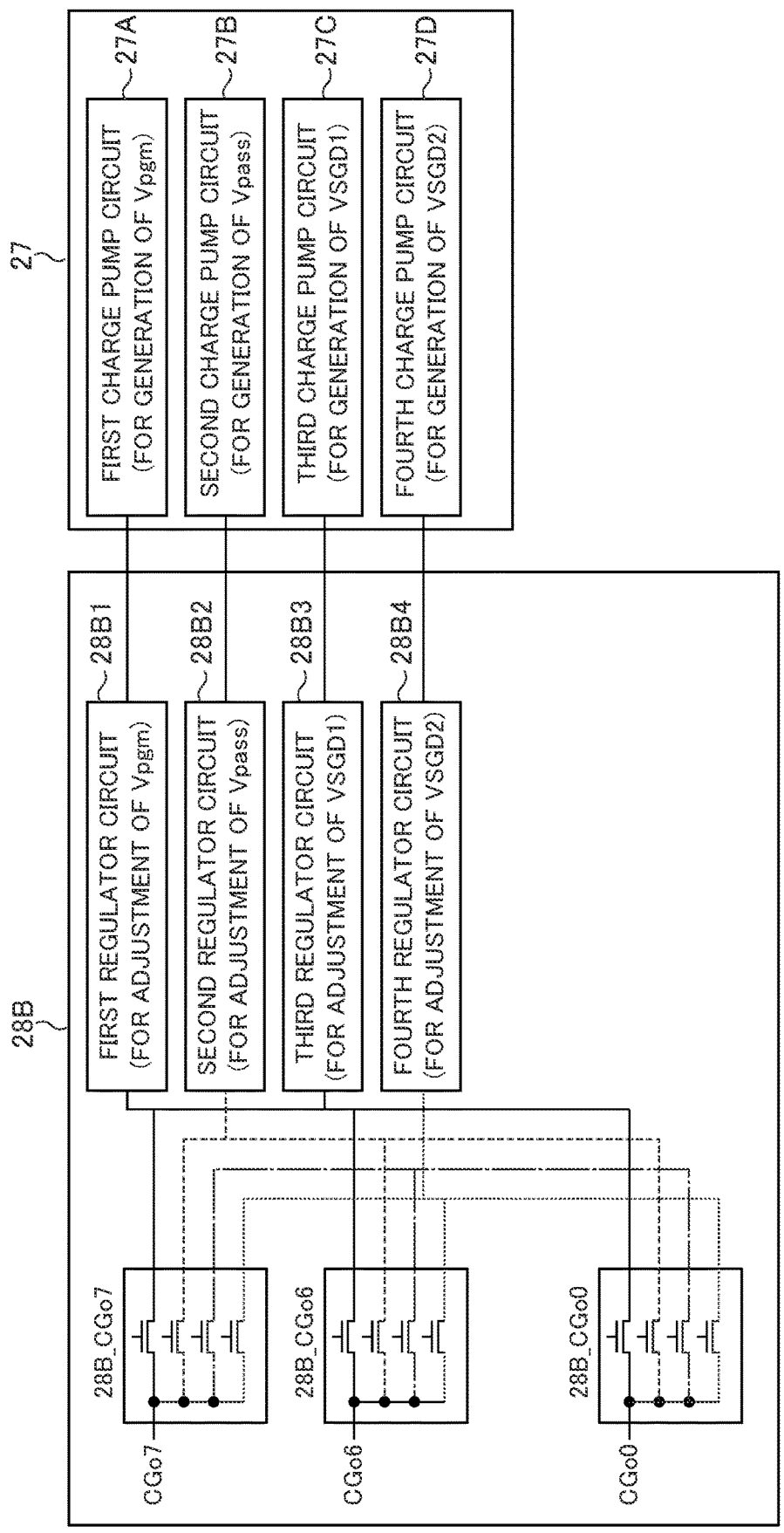
FIG. 17 is a schematic diagram for explaining the electric connectivity between the voltage generation circuit 27 and the odd-numbered word line driver 28 according to the first embodiment.

FIG. 17 is a schematic diagram for explaining the electrical connection between the voltage generation circuit 27 and the odd side driver 28B according to embodiments.

The voltages Vpgm, Vpass, VSGD1, and VSGD2 are held by a first regulator circuit 28B1, a second regulator circuit 28B2, a third regulator circuit 28B3, and a fourth regulator circuit 28B4 in the odd side driver 28B, respectively. Then, the voltages Vpgm, Vpass, VSGD1, and VSGD2 are appropriately added and supplied to the signal lines CGo0, . . . , CGo7.

Figure 18:
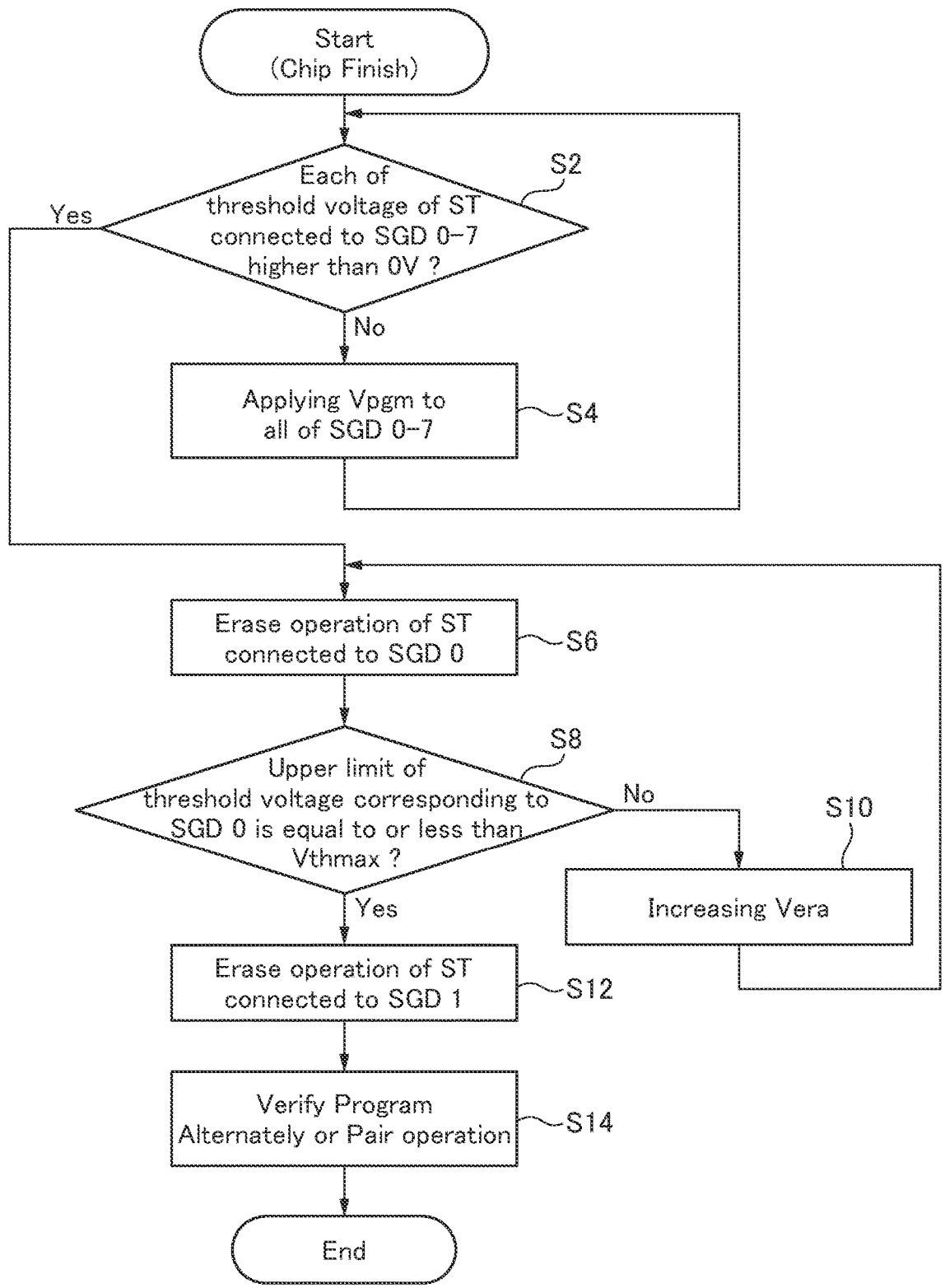
FIG. 18 is a flow chart illustrating the operation of the semiconductor memory device according to the first embodiment.

FIG. 18 is a flow chart illustrating the semiconductor memory device according to the present embodiment. In the semiconductor memory device according to the present embodiment, the threshold voltage of the selection transistor ST connected to the select gate line SGD is adjusted.

First, it is determined whether or not there is a selection transistor ST connected to the select gate lines SGD having a threshold voltage lower than the reference voltage Vss (S2, an exemplary first step). This is because if the selection transistor ST having a voltage lower than the reference voltage Vss exists, the operation for each of the substrings connected to each of the select gate lines SGD cannot be divided. Specifically, Vb1 is applied to each of the bit line BL. Vss is applied to the select gate lines SGD0 to 7. Vread is applied to the dummy word lines WLDDe1, WLDDo1, WLDDe0 and WLDDo0. Vread is applied to the word lines WLe and the word lines WLo. Vread is applied to the dummy word lines WLDSe1, WLDSo1, WLDSe0 and WLDSo0. Vsg is applied to the select gate line SGSe and the select gate line SGSo. Vss is applied to the source line SL.

Here, the reference voltage Vss (exemplary first voltage) is not particularly limited, but is, for example, a 0V. Vb1 (exemplary second voltage) is a voltage applied to the bit line BL during a read operation of the memory cell transistor MT. Vb1 is not particularly limited, but is, for example, 1V. Vread (exemplary third voltage) is a voltage applied to the unselected wordline during the read operation, and is a voltage for turning on the memory cell transistor MT regardless of the held data. Vread is not particularly limited, but is, for example, 5V. Vsg is a voltage that turns on the selection transistor ST, and is, for example, a 2.5V.

When a current flows through any of the substring connected to the select gate line SGD0 to 7, it indicates that there is a the selection transistor ST having a threshold voltage lower than the reference voltage Vss. Then, the threshold voltages of the selection transistors ST connected to the select gate lines SGD0 to 7 are increased (S4, an exemplary second step). Specifically, Vss is applied to each of the bit line BL. Vpgm is applied to the select gate lines SGD0 to 7. Vpass is applied to the dummy word lines WLDDe1, WLDDo1, WLDDe0 and WLDDo0. Vpass is applied to the word lines WLe and the word lines WLo. Vpass is applied to the dummy word lines WLDSe1, WLDSo1, WLDSe0 and WLDSo0. Vsg is applied to the select gate lines SGSe and the select gate line SGSo. Vss is applied to the source line SL.

Here, Vpgm (an exemplary fourth voltage) is a voltage applied to the memory cell transistor MT when performing a write operation. Vpgm is not particularly limited, but is, for example, 20V. Vpass (exemplary fifth voltage) is not particularly limited, but is, for example, a 10V.

After the operation shown in S4 of FIG. 18 is performed, the operation is returned to S2 again, to determine whether there is the selection transistor ST connected to the select gate line SGD having a threshold voltage lower than the reference voltage Vss.

If no current flows in all of the substrings connected to the select gate lines SGD0 to 7, it is determined that there is no the selection transistor ST connected to the select gate line SGD that has a threshold voltage lower than the reference voltage Vss. Therefore, an erase operation of the selection transistor ST connected to the select gate line SGD0 is performed (S6, an exemplary third step). Specifically, Vss is applied to the bit line BL0. VDDSA is applied to the bit line BL1, the bit line BL2, and the bit line BL3. Vss is applied to the select gate line SGD0. Vpass is applied to the select gate lines SGD1 to 7. Vpass is applied to the dummy word lines WLDDe1, WLDDo1, WLDDe0 and WLDDo0. Vpass is applied to the plurality of word lines WLe and the plurality of word lines WLo. Vpass is applied to the dummy word lines WLDSe1, WLDSo1, WLDSe0 and WLDSo0. "Vera-ΔV" is applied to the select gate line SGSe and the select gate line SGSo. Vera is applied to the source line SL.

Here, VDDSA is applied to the unselected the bit line BL. VDDSA is not particularly limited, but is, for example, 2.5V. "Vera-ΔV" (an exemplary sixth voltage) is not particularly limited, but is, for example, a 13V. Vera (exemplary seventh voltage) is, for example, a 20V. Vera is higher than the "Vera-ΔV". ΔV is not particularly limited, but is, for example, 7V.

Next, whether the upper limit of the threshold voltage of the selection transistor ST connected to the select gate line SGD0 is equal to or less than Vthmax is checked (S8, verification operation, and exemplary fourth step).

FIG. 19 is an exemplary voltage applied in S8 of FIG. 18. Specifically, Vb1 is applied to the bit line BL. Vcgrv (Vthmax) is applied to the select gate line SGD0. Vbb is applied to the select gate line SGD1. Vss is applied to the select gate lines SGD2 to 7. Vread is applied to the dummy word line WLDDe1. Vbb is applied to the dummy word line WLDDo1. Vread is applied to the dummy word line WLDDe0, the dummy word line WLDDo0, the word lines WLe, and the word lines WLo. Vread is applied to the dummy word line WLDSe1, WLDSo1, WLDSe0 and WLDSo0. Vsg is applied to the select gate line SGSe. Vss is applied to the select gate line SGSo. Vss is applied to the source line SL.

Vbb is an exemplary tenth voltage, and is not particularly limited, but is, for example, −3V. Vbb is, for example, lower than Vss. Vcgrv(Vthmax) is an exemplary eighth voltage, and is a voltage that is desired to be an upper limit of the threshold of the selection transistor ST connected to the select gate line SGD0. Vcgrv(Vthmax) is, for example, higher than Vss.

In S8 of FIG. 18, when current flows through the substring connected to the select gate line SGD0, it is determined that the upper limit of the threshold voltage of the selection transistor ST connected to the select gate line SGD0 is higher than Vthmax. Then, Vera applied to the source line SL is increased to perform an erase operation of the selection transistor ST connected to the select gate line SGD0 (S10 and S6, an exemplary fifth step). Specifically, Vss is applied to each of the bit line BL. Vss is applied to the select gate line SGD0. Vpass is applied to the select gate lines SGD1 to 7. Vpass is applied to the dummy word lines WLDDe1, WLDDo1, WLDDe0 and WLDDo0. Vpass is applied to the word lines WLe and the word lines WLo. Vpass is applied to the dummy word lines WLDSe1, WLDSo1, WLDSe0 and WLDSo0. Vera1-ΔV is applied to the select gate line SGSe and the select gate line SGSo. Vera1 higher than Vera is applied to the source line SL.

Vera1 (exemplary ninth voltage) is not particularly limited, but is, for example, a 22V.

Then, it is checked whether the upper limit of the threshold voltage of the selection transistor ST corresponding to (connected to) the select gate line SGD0 is equal to or less than Vthmax (S8, verify operation). When a current flows through the substring connected to the select gate line SGD0, Vera1 applied to the source line SL is increased to a higher voltage Vera2 to perform an erase operation of the selection transistor ST connected to the select gate line SGD0 (S10 and S6, an exemplary fifth step).

When it is confirmed that the upper limit of the threshold voltage of the selection transistor ST corresponding to (connected to) the select gate line SGD0 is equal to or lower than Vthmax, an erase operation of the selection transistor ST connected to the select gate line SGD1 is performed (S12, an exemplary sixth step).

Here, for example, when it is confirmed that the upper limit of the threshold voltage of the selection transistor ST corresponding to (connected to) the select gate line SGD0 is equal to or lower than Vthmax by applying the voltage Vera1 to the source line SL, Vera1 is applied to the source line SL for the erase operation of the selection transistor ST connected to the select gate line SGD1, too. Specifically, Vss is applied to each of the bit line BL. Vss is applied to the select gate line SGD0. Vpass is applied to the select gate lines SGD1 to 7. Vpass is applied to the dummy word lines WLDDe1, WLDDo1, WLDDe0 and WLDDo0. Vpass is applied to the word lines WLe and the word lines WLo. Vpass is applied to the dummy word lines WLDSe1, WLDSo1, WLDSe0 and WLDSo0. Vera1-ΔV is applied to the select gate line SGSe and the select gate line SGSo. Vera1 is applied to the source line SL.

The source line SL may be applied with a voltage Vera1' equal to or higher than Vera1. By setting the voltage applied to the source line SL during the selection transistor ST erase operation connected to the select gate line SGD1 to the voltage higher than the voltage Vera1 (Vera1 is the voltage applied to the source line SL when it is confirmed that the upper limit of the threshold voltage of the selection transistor ST connected to the select gate line SGD0 is equal to or lower than Vthmax), the upper limit of the threshold voltage of the selection transistor connected to the select gate line SGD1 can be more reliably set to be less than or equal to Vthmax, even when there is a variation in the erasing characteristic due to the structural variation between the select gate line SGD1 and the select gate line SGD0, for example.

Further, for example, when it is confirmed that the upper limit of the threshold voltage of the selection transistor ST corresponding to (connected to) the select gate line SGD0 is equal to or lower than Vthmax by applying the voltage Vera2 to the source line SL, Vera2 is applied to the source line SL during the erase operation of the selection transistor ST connected to the select gate line SGD1, too. Specifically, Vss is applied to each of the bit line BL. Vss is applied to the select gate line SGD0. Vpass is applied to the select gate lines SGD1 to 7. Vpass is applied to the dummy word lines WLDDe1, WLDDo1, WLDDe0 and WLDDo0. Vpass is applied to the plurality of word lines WLe and the plurality of word lines WLo. Vpass is applied to the dummy word lines WLDSe1, WLDSo1, WLDSe0 and WLDSo0. Vera2-ΔV is applied to the select gate line SGSe and the select gate line SGSo. Vera2 is applied to the source line SL. In this case, the source line SL may be applied with a voltage Vera2' equal to or higher than Vera2, too.

Then, in S14, write operation is performed on the selection transistor ST connected to SGD0 and SGD1, and the threshold voltage is set. The details will be described in the second embodiment and the third embodiment.

FIG. 20 is another exemplary voltage applied in S8 of FIG. 18. Except for applying Vbb to the select gate lines SGD2 to 7, it is the same as the voltage shown in FIG. 19.

FIG. 21 is another exemplary voltage applied in S8 of FIG. 18. Except for applying Vbb+Vm to the select gate lines SGD2 to 7, it is the same as the voltage shown in FIG. 19. Here, "Vbb+Vm" (an exemplary eleventh voltage) is a voltage that is greater than Vbb and less than Vread.

FIG. 22 is another exemplary voltage applied in S8 of FIG. 18. Except for applying Vbb+Vm to the dummy word line WLDDo1, it is the same as the voltage shown in FIG. 19.

Next, the operation and effects the present embodiment will be described.

As comparative embodiment of the present embodiment, consider that an erase operation of the selection transistor ST connected to the select gate line SGD0 and a verify operation are performed, and then an erase operation of the selection transistor ST connected to a the select gate line SGD1 is performed by applying Vera to the source line. In this case, the selection transistor ST connected to the select gate line SGD0 will be switched on at all times, regardless of whether the selection transistor ST connected to the select gate line SGD1 is switched on or off, because the threshold voltage of the selection transistor ST connected to the select gate line SGD0 is decreased. Therefore, an appropriate verify operation of the selection transistor ST connected to the select gate line SGD1 cannot be performed.

Therefore, in the semiconductor memory device of the present embodiment, when performing the erase operation of the selection transistor ST connected to the select gate line SGD1, Vera1 used for the erase operation of the selection transistor ST connected to the select gate line SGD0 or a higher voltage is applied to the source line SL. The selection transistor ST connected to the select gate line SGD0 and the select gate line SGD0, and the selection transistor ST connected to the select gate line SGD1 and the select gate line SGD1, are considered to have the similar structure. Therefore, it is considered that the erase operation of the selection transistor ST connected to the select gate line SGD1 can be performed by using the above-described Vera1 or higher when the erase operation of the selection transistor ST connected to the select gate line SGD1 is performed.

Note that the same process can be used for the erase operation of the selection transistor ST connected to the select gate lines SGD2 to 7.

Further, in the fourth step, by applying Vbb to the select gate line SGD1 and applying Vbb to the dummy word line WLDDo1, it is possible to make it easier to deselect the memory cell transistor MT belonging to the substring 50o.

Further, in the fourth step, by applying Vbb to the select gate lines SGD2 to 7, it is possible to make it easier to deselect the memory cell transistor MT belonging to the substring connected to the select gate lines SGD2 to 7.

Further, in the fourth step, when Vbb+Vm is applied to VLDDo1, the voltage between the selection transistor ST connected to SGD1, the memory cell transistor ST connected to the dummy word line WLDDo1, and the memory cell transistor MT connected to the wordline WL, can be changed more slowly.

According to the semiconductor memory device of the present embodiment, the semiconductor memory device with improved reliability can be provided.

Second Embodiment

Figure 23:
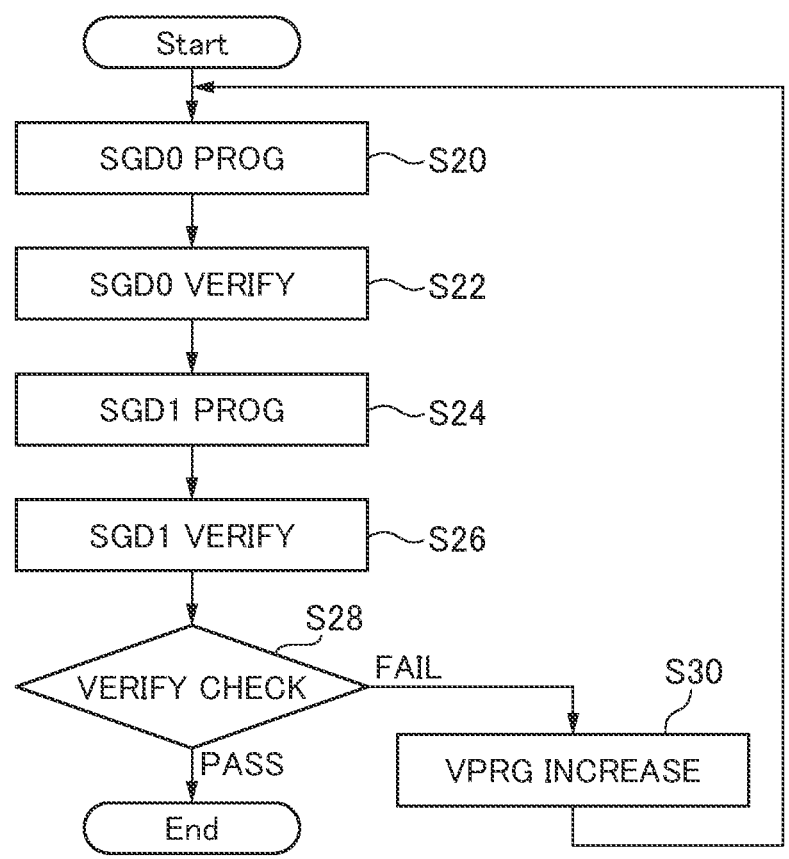
FIG. 23 is a flow chart for explaining the operation of the semiconductor memory device according to the second embodiment.
Figure 24A:
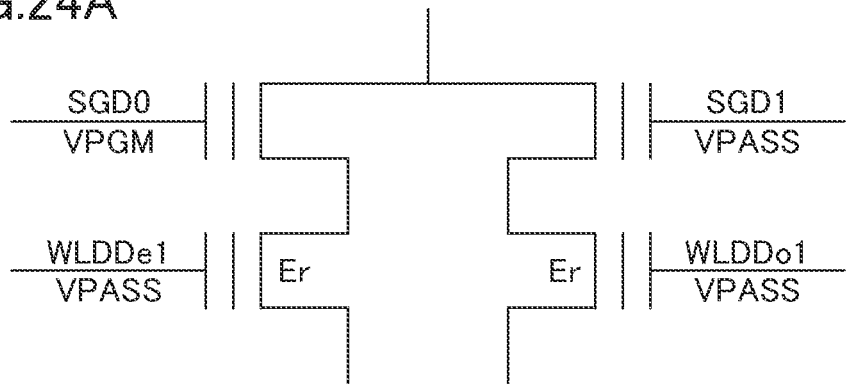
FIG. 24A-D are schematic diagrams illustrating exemplary voltage applied to the selection transistors ST connected to the select gate lines SGD and dummy transistors ST.
Figure 24B:
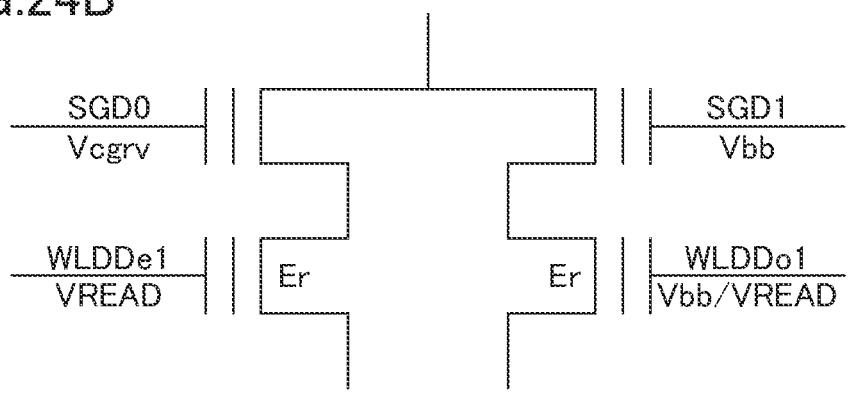
Figure 24C:
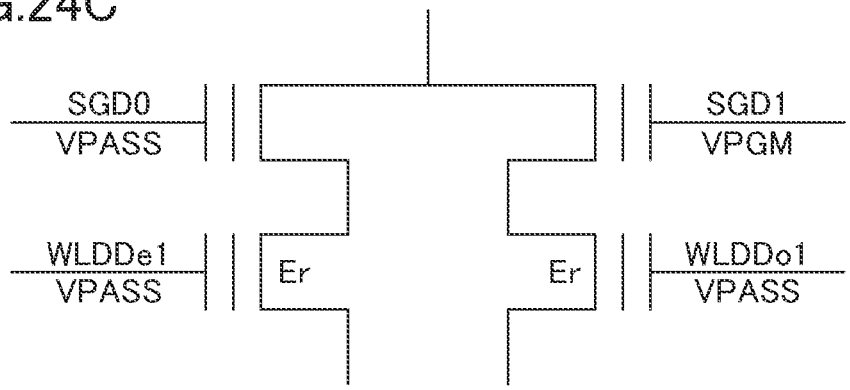
Figure 24D:
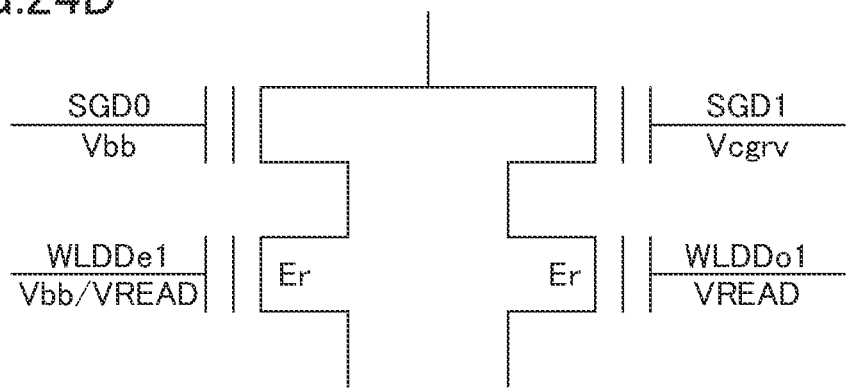

FIG. 23 is a flow chart for explaining the operation of the semiconductor memory device according to the present embodiment. FIG. 24A-D are schematic diagrams illustrating an exemplary voltage applied to the selection transistor ST connected to the select gate line SGD and the dummy transistor ST in the flowchart shown in FIG. 23. An exemplary voltage shown in FIG. 24A corresponds to the step shown in (S20) of FIG. 23. An exemplary voltage shown in FIG. 24B corresponds to the step shown in (S22) of FIG. 23. An exemplary voltage shown in FIG. 24C corresponds to the step shown in (S24) of FIG. 23. An exemplary voltage shown in FIG. 24D corresponds to the step shown in (S26) of FIG. 23.

In the description of the present embodiment, the operation of S14 of FIG. 18 for adjusting the threshold voltage of the selection transistor SGD connected to the select gate line SGD will be described in detail.

First, a write operation is performed on the selection transistor ST connected to the select gate line SGD0 (S20, an exemplary seventh step). Specifically, Vss is applied to the bit line BL0. VDDSA is applied to the bit line BL1, the bit line BL2 and the bit line BL3. Vpgm is applied to the select gate line SGD0. Vpass is applied to the select gate line SGD1 to 7. Vpass is applied to the dummy word lines WLDDe1, WLDDo1, WLDDe0 and WLDDo0. Vpass is applied to the word lines WLe and the word lines WLo. Vpass is applied to the dummy word lines WLDSe1, WLDSo1, WLDSe0 and WLDSo0. Vss is applied to the select gate line SGSe and the select gate line SGSo.

Next, it is checked whether or not the lower limit of the threshold of the selection transistor ST corresponding to (connected to) the select gate line SGD0 is Vthmin (S22, a verify operation, an exemplary eighth step). Specifically, Vb1 is applied to each of the bit line BL. Vcgrv(Vthmin) is applied to the select gate line SGD0. Vbb is applied to the select gate line SGD1. Vss is applied to the select gate line SGD2 to 7. Vread is applied to the dummy word lines WLDDe1, WLDDe0 and WLDDo0. Vbb is applied to the dummy word line WLDDo1. Vread is applied to the word lines WLe and the word lines WLo. Vread is applied to the dummy word lines WLDSe1, WLDSo1, WLDSe0 and WLDSo0. Vsg is applied to the select gate line SGSe. Vss is applied to the select gate line SGSo. Vread may be applied to the dummy word line WLDDo1.

Vcgrv(Vthmin) is an exemplary twelfth-voltage. Vcgrv(Vthmin) is not particularly limited, but is lower than Vcgrv(Vthmax).

Next, a write operation is performed on the selection transistor ST connected to the select gate line SGD1 (S24, an exemplary ninth step). Specifically, Vss is applied to each of the bit line BL. Vpass is applied to the select gate line SGD0. Vpgm is applied to the select gate line SGD1. Vpass is applied to the select gate lines SGD2 to 7. Vpass is applied to the dummy word lines WLDDe1, WLDDo1, WLDDe0 and WLDDo0. Vpass is applied to the word lines WLe and the word lines WLo. Vpass is applied to the dummy word lines WLDSe1, WLDSo1, WLDSe0 and WLDSo0. Vss is applied to the select gate line SGSe and the select gate line SGSo.

Next, a verify operation is performed to check whether or not the lower limit of the threshold of the selection transistor ST corresponding to (connected to) the select gate line SGD1 is Vthmin (S26, an exemplary tenth step). Specifically, Vb1 is applied to each the bit line BL. Vbb is applied to the select gate line SGD0. Vcgrv(Vthmin) is applied to the select gate line SGD1. Vss is applied to the select gate line SGD2 to 7. Vbb is applied to the dummy word line WLDDe1. Vread is applied to the dummy word lines WLDDo1, WLDDe0 and WLDDo0. Vread is applied to the word lines WLe and the word lines WLo. Vread is applied to the dummy word lines WLDSe1, WLDSo1, WLDSe0 and WLDSo0. Vss is applied to the select gate line SGSe. Vsg is applied to the select gate line SGSo. Vread may be applied to the dummy word line WLDDe1.

Next, when a current flows through the substring connected to the select gate line SGD0 in S22 of FIG. 23 and when a current flows through the substring connected to the select gate line SGD1 in S26 of FIG. 23, it is determined that the threshold voltage of the selection transistor ST connected to the select gate line SGD0 and the threshold voltage of the selection transistor ST connected to the select gate line SGD1 are controlled to be equal to or higher than Vthmin, and the series of operations is ended (S28).

On the other hand, if no current flows through the substring connected to the select gate line SGD0, it is determined that the threshold voltage of the selection transistor ST connected to the select gate line SGD0 is not controlled to be equal to or higher than Vthmin, Vpgm is increased, and the operation of S20 and S22 in FIG. 23 is performed again (S28, S30, S20 and S22).

Further, if no current flows through the substring connected to the select gate line SGD1, it is determined that the threshold voltage of the selection transistor ST connected to the select gate line SGD1 is not controlled to be equal to or higher than Vthmin, Vpgm is increased, and the operation of S24 and S26 in FIG. 23 is performed again (S28, S30, S24 and S26).

It becomes further easier to deselect the substring connected to the select gate line SGD0 by applying Vbb to the select gate line SGD0 and the dummy word line WLDDe1.

It becomes further easier to deselect the substring connected to the select gate line SGD1 by applying Vbb to the select gate line SGD1 and the dummy word line WLDDo1.

According to the semiconductor memory device of the present embodiment, the semiconductor memory device with improved reliability can be provided.

Third Embodiment

Figure 25:
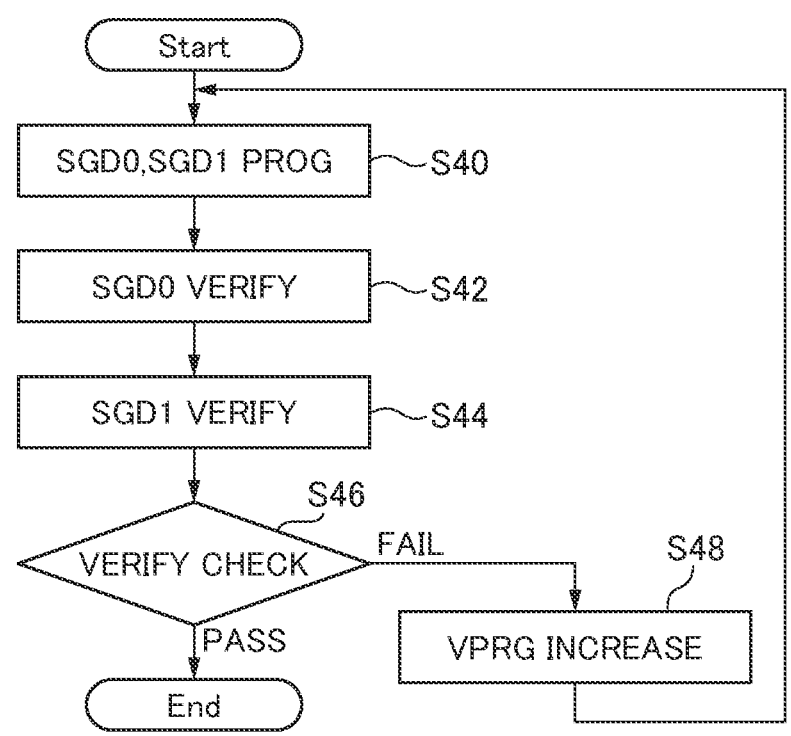
FIG. 25 is a flow chart for explaining the operation of the semiconductor memory device according to the third embodiment.
Figure 26A:
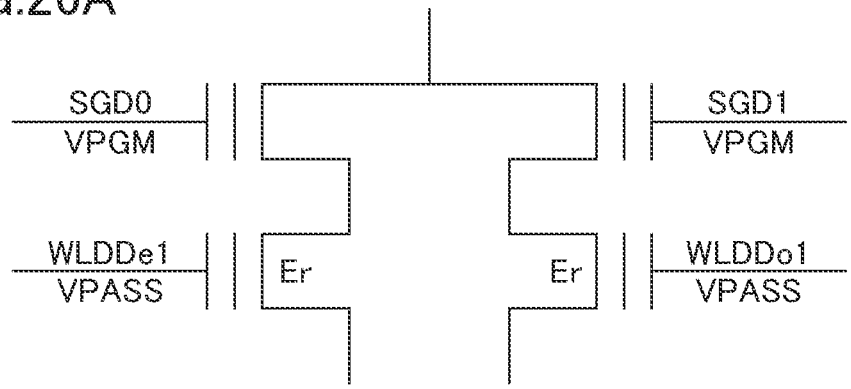
FIG. 26A-C are schematic diagrams illustrating exemplary voltage applied to the selection transistors ST connected to the select gate lines SGD and dummy transistors ST.
Figure 26B:
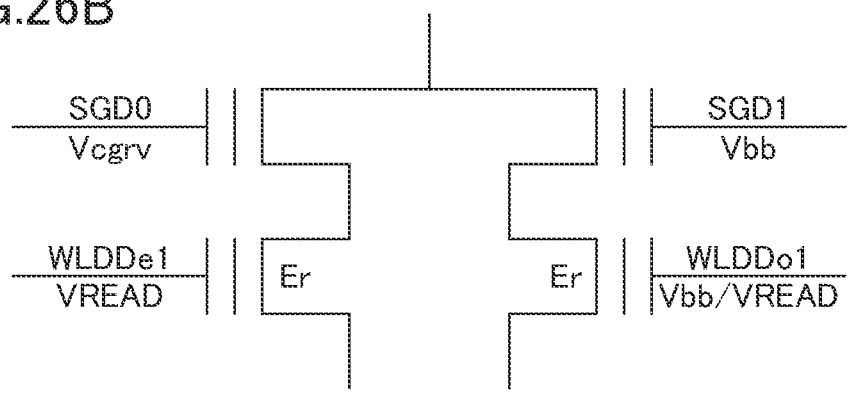
Figure 26C:
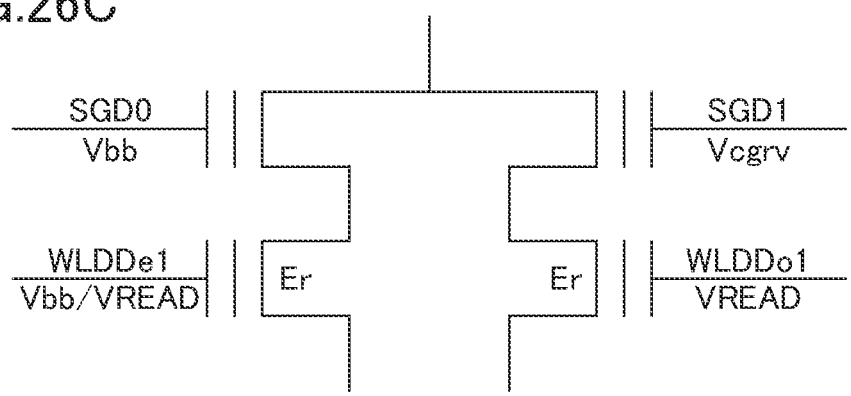

FIG. 25 is a flow chart for explaining the operation of the semiconductor memory device according to the present embodiment. FIG. 26A-C are schematic diagrams illustrating an exemplary voltage applied to the selection transistor ST connected to the select gate line SGD and the dummy transistor ST in the flowchart shown in FIG. 25. An exemplary voltage shown in FIG. 26A corresponds to the step shown in (S40) of FIG. 25. An exemplary voltage shown in FIG. 26B corresponds to the step shown in (S42) of FIG. 25. An exemplary voltage shown in FIG. 26C corresponds to the step shown in (S44) of FIG. 25.

In the description of the present embodiment, the operation of S14 of FIG. 18 for adjusting the threshold voltage of the selection transistor SGD connected to the select gate line SGD will be described in detail. The difference from the second embodiment is that the write operation on the selection transistor ST connected to the select gate line SGD0 and the write operation on the selection transistor ST connected to the select gate line SGD1 are simultaneously performed.

First, a write operation is performed on the selection transistor ST connected to the select gate line SGD0 and the selection transistor ST connected to the select gate line SGD1 (S40, an exemplary eleventh step). Specifically, Vss is applied to each the bit line BL. Vpgm is applied to the select gate line SGD0 and the select gate line SGD1. Vpass is applied to the select gate line SGD2 to 7. Vpass is applied to the dummy word lines WLDDe1, WLDDo1, WLDDe0 and WLDDo0. Vpass is applied to the word lines WLe and the word lines WLo. Vpass is applied to the dummy word lines WLDSe1, WLDSo1, WLDSe0 and WLDSo0. Vsg is applied to the select gate line SGSe and the select gate line SGSo.

Next, a verify operation is performed to check whether or not the lower limit of the threshold of the selection transistor ST corresponding to (connected to) the select gate line SGD0 is Vthmin (S42, an exemplary twelfth step). Specifically, Vb1 is applied to each of the bit lines BL. Vcgrv (Vthmin) is applied to the select gate line SGD0. Vbb is applied to the select gate line SGD1. Vss is applied to the select gate lines SGD2 to 7. Vread is applied to the dummy word lines WLDDe1, WLDDe0 and WLDDo0. Vbb is applied to the dummy word line WLDDo1. Vread is applied to the word lines WLe and the word lines WLo. Vread is applied to the dummy word lines WLDSe1, WLDSo1, WLDSe0 and WLDSo0. Vsg is applied to the select gate line SGSe. Vss is applied to the select gate line SGSo. Vread may be applied to the dummy word line WLDDo1.

Next, a verify operation is performed to check whether or not the lower limit of the threshold of the selection transistor ST corresponding to (connected to) the select gate line SGD1 is Vthmin (S44, an exemplary thirteenth step). Specifically, Vb1 is applied to each of the bit lines BL. Vbb is applied to the select gate line SGD0. Vcgrv(Vthmin) is applied to the select gate line SGD1. Vss is applied to the select gate line SGD2 to 7. Vbb is applied to the dummy word line WLDDe1. Vread is applied to the dummy word lines WLDDo1, WLDDe0 and WLDDo0. Vread is applied to the word lines WLe and the word lines WLo. Vread is applied to the dummy word lines WLDSe1, WLDSo1, WLDSe0 and WLDSo0. Vss is applied to the select gate line SGSe. Vsg is applied to the select gate line SGSo. Vread may be applied to the dummy word line WLDDe1.

Next, when a current flows through the substring connected to the select gate line SGD0 in S42 of FIG. 25 and when a current flows through the substring connected to the select gate line SGD1 in S44 of FIG. 25, it is determined that the threshold voltage of the selection transistor ST connected to the select gate line SGD0 and the threshold voltage of the selection transistor ST connected to the select gate line SGD1 are controlled to be equal to or higher than Vthmin, and the series of operations is ended (S46).

On the other hand, if no current flows through the substring connected to the select gate line SGD0, it is determined that the threshold voltage of the selection transistor ST connected to the select gate line SGD0 is not controlled to be equal to or higher than Vthmin, Vpgm is increased, and the operation of S40 and S22 in FIG. 25 is performed again (S46, S48, S40 and S42).

Further, if no current flows through the substring connected to the select gate line SGD1, it is determined that the threshold voltage of the selection transistor ST connected to the select gate line SGD1 is not controlled to be equal to or higher than Vthmin, Vpgm is increased, and the operation of S40 and S44 in FIG. 25 is performed again (S46, S48, S40 and S44).

According to the semiconductor memory device of the present embodiment, the semiconductor memory device with improved reliability can be provided.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate having a substrate surface extending in a first direction and a second direction intersecting the first direction;
a source line provided separately from the substrate in a third direction intersecting the first direction and the second direction;
a bit line provided separately from the source line in the third direction, the bit line extending in the second direction;
a first memory pillar extending from the source line in the third direction, the first memory pillar including
a first substring including
a first selection transistor provided between the source line and the bit line,
a first dummy transistor provided between the first selection transistor and the bit line,
a plurality of first memory cell transistors provided between the first dummy transistor and the bit line,
a second dummy transistor provided between the first memory cell transistors and the bit line,
a third dummy transistor provided between the second dummy transistor and the bit line, and
a second selection transistor provided between the third dummy transistor and the bit line, and
a second substring including:
a third selection transistor provided between the source line and the bit line,
a fourth dummy transistor provided between the third selection transistor and the bit line,
a plurality of second memory cell transistors provided between the fourth dummy transistor and the bit line,
a fifth dummy transistor provided between the second memory cell transistors and the bit line,
a sixth dummy transistor provided between the fifth dummy transistor and the bit line, and
a fourth selection transistor provided between the sixth dummy transistor and the bit line,
a second memory pillar extending from the source line in the third direction, the second memory pillar provided separately from the first memory pillar in the second direction, the second memory pillar including
a third substring including:
a fifth selection transistor provided between the source line and the bit line,
a seventh dummy transistor provided between the fifth selection transistor and the bit line,
a plurality of third memory cell transistors provided between the seventh dummy transistor and the bit line,
an eighth dummy transistor provided between the third memory cell transistors and the bit line,
a ninth dummy transistor provided between the eighth dummy transistor and the bit line, and
a sixth selection transistor provided between the ninth dummy transistor and the bit line,
a fourth substring including:
a seventh selection transistor provided between the source line and the bit line,
a tenth dummy transistor provided between the seventh selection transistor and the bit line,
a plurality of fourth memory cell transistors provided between the tenth dummy transistor and the bit line,
an eleventh dummy transistor provided between the fourth memory cell transistors and the bit line,
a twelfth dummy transistor provided between the eleventh dummy transistor and the bit line, and
an eighth selection transistor provided between the twelfth dummy transistor and the bit line,
a first select gate line connected to the first selection transistor and the fifth selection transistor;
a second select gate line connected to the third selection transistor and the seventh selection transistor;
a first dummy word line connected to the first dummy transistor and the seventh dummy transistor;
a second dummy word line connected to the fourth dummy transistor and the tenth dummy transistor;
a plurality of first word lines connected to each of the first memory cell transistors and each of the third memory cell transistors;
a plurality of second word lines connected to each of the second memory cell transistors and each of the fourth memory cell transistors;
a third dummy word line connected to the second dummy transistor and the eighth dummy transistor;
a fourth dummy word line connected to the fifth dummy transistor and the eleventh dummy transistor;
a fifth dummy word line connected to the third dummy transistor and the ninth dummy transistor;
a sixth dummy word line connected to the sixth dummy transistor and the twelfth dummy transistor;
a third select gate line connected to the second selection transistor;
a fourth select gate line connected to the fourth selection transistor;
a fifth select gate line connected to the sixth selection transistor;
a sixth select gate line connected to the eighth selection transistor;
a driver for supplying a voltage, the driver
performing a first step of applying a second voltage higher than a first voltage to the bit line, applying the first voltage to the third select gate line, the fourth select gate line, the fifth select gate line and the sixth select gate line, applying a third voltage higher than the first voltage to the first word lines and the second word lines, and applying the first voltage to the source line,
in the first step, when a current flows through the first substring, the second substring, the third substring, or the fourth substring, performing a second step of applying the first voltage to the bit line, applying a fourth voltage higher than the third voltage to the third select gate line, the fourth select gate line, the fifth select gate line, and the sixth select gate line, and applying a fifth voltage higher than the third voltage and lower than the fourth voltage to the first word lines and the second word lines,
in the first step, when no current flows through the first substring, the second substring, the third substring, and the fourth substring, performing a third step of applying the first voltage to the bit line, applying the first voltage to the third select gate line, applying the fifth voltage to the fourth select gate line, the fifth select gate line, and the sixth select gate line, applying a sixth voltage higher than the fifth voltage to the first select gate line and the second select gate line, and applying a seventh voltage higher than the sixth voltage to the source line, performing a fourth step of applying the second voltage to the bit line, applying an eighth voltage to the third select gate line, and applying the third voltage to the third dummy word line, the fourth dummy word line, the fifth dummy word line, the first word lines and the second word lines, in the fourth step, when a current flows through the first substring, performing a fifth step of applying the first voltage to the bit line, applying the first voltage to the third select gate line, applying the fifth voltage to the fourth select gate line, the fifth select gate line and the sixth select gate line, and applying a ninth voltage higher than the seventh voltage to the source line, and in the fourth step, when no current flows through the first substring, performing a sixth step of applying the first voltage to the bit line, applying the first voltage to the fourth select gate line, applying the fifth voltage to the third select gate line, the fifth select gate line and the sixth select gate line, and applying the ninth voltage to the source line.

2. The semiconductor memory device according to claim 1, wherein
in the fourth step, the driver applies a tenth voltage lower than the first voltage to the fourth select gate line.

3. The semiconductor memory device according to claim 2, wherein
in the fourth step, the driver applies a tenth voltage lower than the first voltage to the fifth select gate line and the sixth select gate line.

4. The semiconductor memory device according to claim 2, wherein
in the fourth step, the driver applies a tenth voltage lower than the first voltage to the sixth dummy word line.

5. The semiconductor memory device according to claim 2, wherein
in the fourth step, the driver applies an eleventh voltage higher than the tenth voltage and lower than the third voltage to the sixth dummy word line.

6. The semiconductor memory device according to claim 1, wherein the driver
after the sixth step, performing a seventh step of applying the first voltage to the bit line, applying the fourth voltage to the third select gate line, applying the fifth voltage to the fourth select gate line, and applying the fifth voltage to the first dummy word line, the second dummy word line, the first word lines, the second word lines, the third dummy word line, the fourth dummy word line, the fifth dummy word line and the sixth dummy word line, performing an eighth step of applying the second voltage to the bit line, applying a twelfth voltage to the third select gate line, applying the tenth voltage to the fourth select gate line, and applying the third voltage to the first dummy word line, the second dummy word line, the first word lines, the second word lines, the third dummy word line, the fourth dummy word line and the fifth dummy word line, performing a ninth step of applying the first voltage to the bit line, applying the fifth voltage to the third select gate line, applying the fourth voltage to the fourth select gate line, and applying the fifth voltage to the first dummy word line, the second dummy word line, the first word lines, the second word lines, the third dummy word line, the fourth dummy word line, the fifth dummy word line and the sixth dummy word line, and performing a tenth step of applying the second voltage to the bit line, applying the tenth voltage to the third select gate line, applying the twelfth voltage to the fourth select gate line, and applying the third voltage to the first dummy word line, the second dummy word line, the first word lines, the second word lines, the third dummy word line, the fourth dummy word line and the sixth dummy word line.

7. The semiconductor memory device according to claim 6, wherein the driver
in the eighth step, the driver applies the tenth voltage to the sixth dummy word line, and
in the tenth step, the driver applies the tenth voltage to the fifth dummy word line.

8. The semiconductor memory device of claim 1, wherein the driver
after the sixth step, performs an eleventh step of applying the first voltage to the bit line, applying the fourth voltage to the third select gate line and the fourth select gate line, and applying the fifth voltage to the first dummy word line, the second dummy word line, the first word lines, the second word lines, the third dummy word line, the fourth dummy word line, the fifth dummy word line and the sixth dummy word line, performs a twelfth step of applying the second voltage to the bit line, applying the twelfth voltage to the third select gate line, applying the tenth voltage to the fourth select gate line, and applying the third voltage to the first dummy word line, the second dummy word line, the first word lines, the second word lines, the third dummy word line, the fourth dummy word line and the fifth dummy word line, and performs a thirteenth step of applying the second voltage to the bit line, applying a tenth voltage to the third select gate line, applying the twelfth voltage to the fourth select gate line, and applying the third voltage to the first dummy word line, the second dummy word line, the first word lines, the second word lines, the third dummy word line, the fourth dummy word line and the fifth dummy word line.

9. The semiconductor memory device according to claim 8, wherein the driver
in the twelfth step, applies the tenth voltage to the sixth dummy word line,
in the thirteenth step, applies the tenth voltage to the fifth dummy word line.

10. The semiconductor memory device according to claim 6, wherein
the twelfth voltage is lower than the eighth voltage.

11. The semiconductor memory device according to claim 8, wherein
the twelfth voltage is lower than the eighth voltage.

* * * * *